(12) United States Patent
Hung et al.

(10) Patent No.: US 6,664,706 B1
(45) Date of Patent: Dec. 16, 2003

(54) ELECTROSTATICALLY-CONTROLLABLE DIFFRACTION GRATING

(75) Inventors: Elmer S. Hung, Foster City, CA (US); Erik R. Deutsch, Cambridge, MA (US); Stephen D. Senturia, Brookline, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 45 days.

(21) Appl. No.: 10/015,732

(22) Filed: Dec. 10, 2001

Related U.S. Application Data

(63) Continuation of application No. 09/537,936, filed on Mar. 29, 2000, now Pat. No. 6,329,738.
(60) Provisional application No. 60/126,844, filed on Mar. 30, 1999.

(51) Int. Cl.[7] .................................. H02N 1/00
(52) U.S. Cl. ...................................... 310/309
(58) Field of Search ......................... 310/309

(56) References Cited

U.S. PATENT DOCUMENTS

| | | | | |
|---|---|---|---|---|
| 5,206,557 A | * | 4/1993 | Bobbio ........................ | 310/309 |
| 5,212,582 A | * | 5/1993 | Nelson ........................ | 359/291 |
| 5,396,066 A | * | 3/1995 | Ikeda et al. .................. | 310/309 |
| 5,658,698 A | * | 8/1997 | Yagi et al. .................... | 310/309 |
| 5,757,536 A | * | 5/1998 | Ricco et al. .................. | 359/224 |
| 5,998,906 A | * | 12/1999 | Jerman et al. ............... | 310/309 |

OTHER PUBLICATIONS

Hung"Extending the Travel Range of Analog–Tuned Electrostatic Actuator IEEE Dec. 1999 p. 497–505".*

Solgaard " Deformable Grating Optical Modulator Optics Letters vol. 17 No. 9 May 1992".*

* cited by examiner

Primary Examiner—Thomas M. Dougherty
Assistant Examiner—Karen Addison
(74) Attorney, Agent, or Firm—Theresa A. Lober

(57) ABSTRACT

The invention provides an electrostatically-controllable diffraction grating including a plurality of electrically isolated and stationary electrodes disposed on a substrate. At least one row of a plurality of interconnected actuation elements is provided, with each actuation element suspended, by a corresponding mechanically constrained support region, over the substrate by a vertical actuation gap and including a conducting actuation region connected to the corresponding support region and disposed in a selected correspondence with at least one substrate electrode. A mirror element is provided, for at least one actuation element in at least one row of actuation elements, including an optically reflecting upper surface, and being vertically suspended over a corresponding actuation element by a mechanically constrained mirror support region that is connected to the corresponding actuation element and that defines a vertical mirror gap. A mirror deflection region connected to the mirror support region and is free to be deflected through the mirror gap. The mirror gap is less than the actuation gap of a corresponding actuation element and is selected to produce controlled and stable displacement of the actuation region of a corresponding actuation element through a displacement range to a specified point in the actuation gap when an actuation voltage is applied between an actuation region and a corresponding stationary electrode. This enables diffraction of a beam of light incident on the grating as the light beam is reflected from the upper surfaces of the mirror elements.

22 Claims, 36 Drawing Sheets

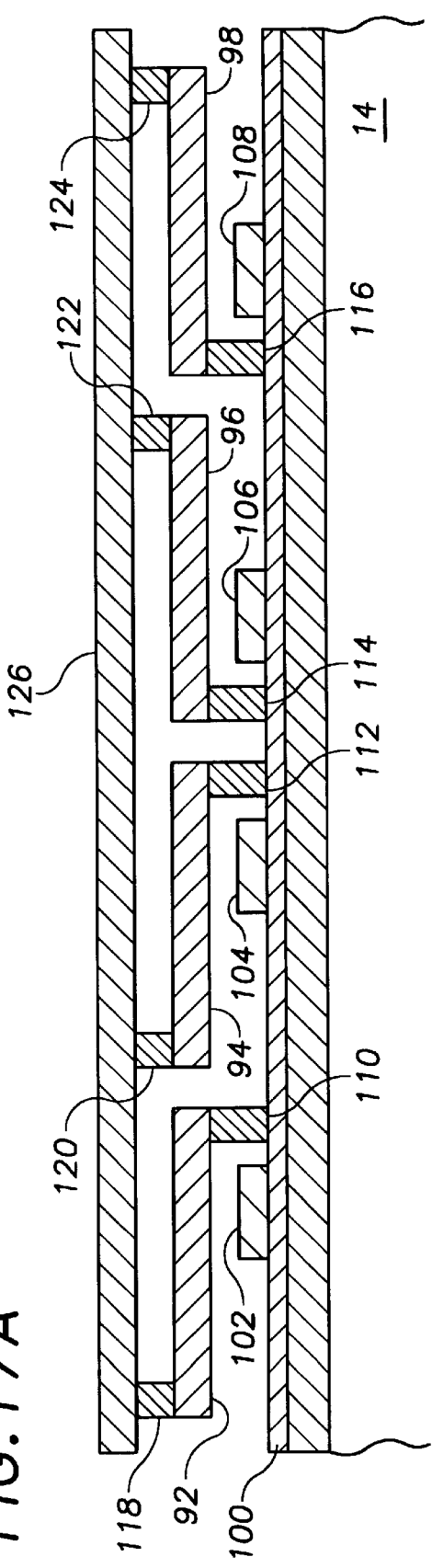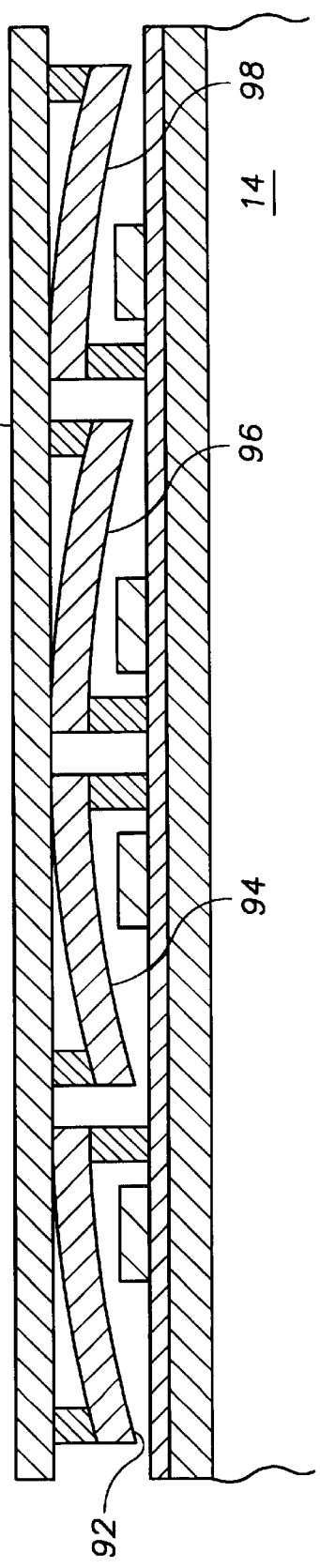
FIG. 17A
FIG. 17B

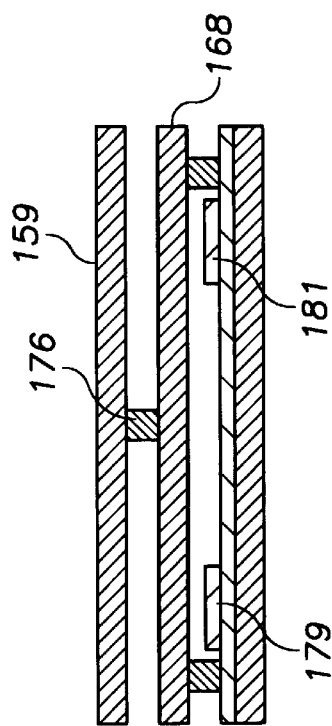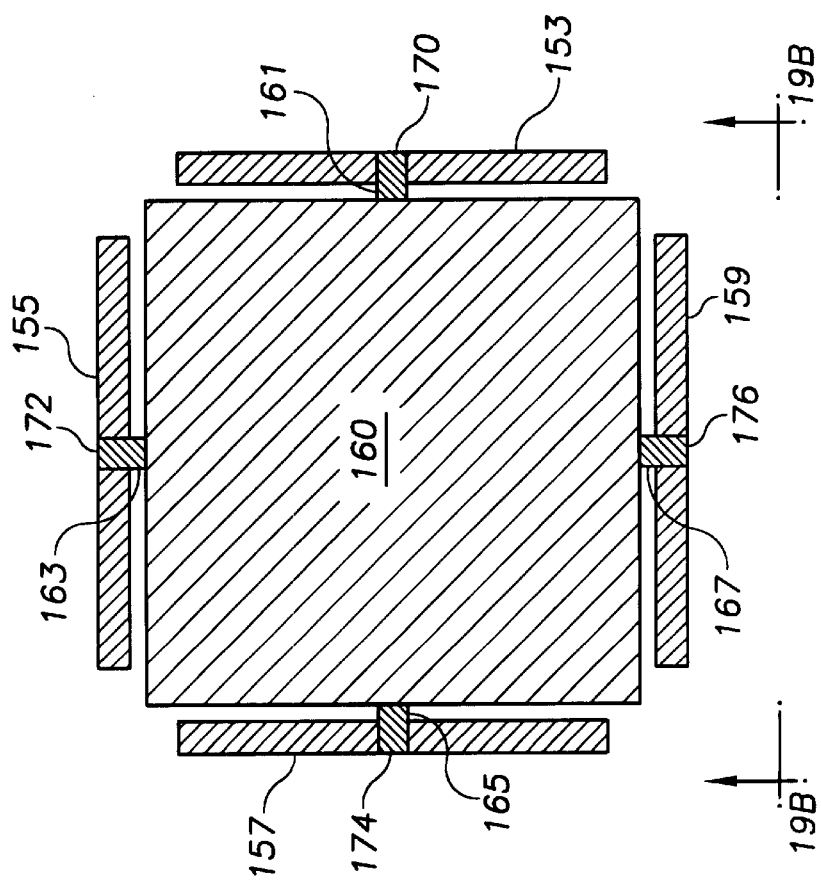

ELECTROSTATICALLY-CONTROLLABLE DIFFRACTION GRATING

CROSS REFERENCE TO RELATED APPLICATIONS

This application is a continuation and claims the benefit of U.S. non-provisional application No. 09/537,936, filed Mar. 29, 2000, now U.S. Pat. No. 6,329,738 which in turn claims the benefit of U.S. Provisional Application No. 60/126,844, filed Mar. 30, 1999, the entirety of both of which are hereby incorporated by reference.

STATEMENT REGARDING FEDERALLY SPONSORED R&D

This invention was made with Government support under Contract Nos. N66001-97-8620 and J-FBI-95-215, both awarded by the Defense Advanced Research Project Agency. The Government has certain rights in the invention.

BACKGROUND OF THE INVENTION

This invention relates to microelectromechanical systems (MEMs), and more particularly relates to electrostatically-actuated structures for MEMs.

MEMs are increasingly being employed for a wide range of applications, in part due to the ability to batch fabricate such microscale systems with a variety of highly complex features and functions. Microscale sensing and actuation applications are particularly well-addressed by MEMs. For many MEMs applications, electrostatically-actuated structures are particularly effective as analog positioning and tuning components within complex microsystems. Electrostatic actuation provides a combination of advantages for the microscale size regime of MEMs, including the ability to produce high energy densities and large force generation, as well as the general ease of electrostatic actuator fabrication, and high operational speed due to relatively small mass. Indeed, for many MEMs applications, electrostatic actuation is preferred.

Electrostatic actuation of a structure is typically accomplished by applying a voltage between an electrode on the structure and an electrode separated from the structure. The resulting attractive electrostatic force between the electrodes enables actuation of the structure toward the separated electrode. This applied electrostatic force is opposed by a characteristic mechanical restoring force that is a function of the structure's geometric and materials properties. Control of the structure's position during actuation requires balancing the applied electrostatic force and inherent mechanical restoring force.

The electrostatic force is a nonlinear function of distance; as the structure moves toward the separated electrode, such that the electrodes' separation distance decreases, the electrostatic force between the electrodes typically increases superlinearly. In contrast, the mechanical restoring force of the structure typically is a linear function of distance. Due to this disparate dependence on distance, not all positions between the electrodes are stable. Specifically, at electrode separations less than some minimum stable separation characteristic of the structure, the structure position is unstable and causes uncontrollable travel of the structure through the remaining distance to the separated electrode. This instability condition, known generally as "pull-in," is a fundamental phenomenon resulting from the interaction of the nonlinear electrostatic force with the linear, elastic restoring force of the structure being actuated. Generally characteristic of all electrostatically-actuated structures, pull-in instability is well-known to severely limit the fraction of an electrode separation gap through which such a structure can be stably positioned.

A separate but related limitation of electrostatically-actuated structures is the relatively high voltage level typically required to position such a structure through a relatively large stable actuation range. As a result of this limitation, in combination with the electrostatic pull-in limitation, electrostatically-actuated structures typically are not well-suited to produce a large range of actuation motion. But for many microscale positioning and tuning systems, such as optical systems, large ranges of travel, and analog tuning of position, can both be critically required. There thus remains a need for electrostatic actuation techniques that enable large ranges of travel and further that are optimized for actuator operation at the lowest possible operational voltage.

SUMMARY OF THE INVENTION

The invention provides electrostatic actuator configurations and actuation mechanisms that enable stable, large range-of-motion electrostatic actuation, achievable with relatively low actuation voltages.

An example electrostatically-controllable actuator in accordance with the invention is an electrostatically-controllable diffraction grating. The diffraction grating includes a plurality of electrically isolated and stationary electrodes that are disposed on a substrate. At least one row of a plurality of interconnected actuation elements is provided. Each actuation element in a row is suspended, by a corresponding mechanically constrained support region, over the substrate by a vertical actuation gap. Each actuation element includes a conducting actuation region connected to the corresponding support region and disposed in a selected correspondence with at least one substrate electrode.

A mirror element is provided for at least one actuation element in at least one row of actuation elements. Each mirror element includes an optically reflecting upper surface. Each mirror element is vertically suspended over a corresponding actuation element by a mechanically constrained mirror support region that is connected to the corresponding actuation element and that defines a vertical mirror gap. Each mirror element also includes a mirror deflection region connected to the mirror support region and free to be deflected through the mirror gap.

The mirror gap of a mirror element is provided as less than the actuation gap of a corresponding actuation element. With this consideration, the mirror gap is then selected to produce controlled and stable displacement of the actuation region of a corresponding actuation element through a displacement range to a specified point in the actuation gap when an actuation voltage is applied between an actuation region and a corresponding stationary electrode. This enables the diffraction of a beam of light incident on the grating as the beam of light is reflected from the upper surfaces of the mirror elements.

The mirror element can be provided as a row of a plurality of interconnected mirror elements provided for at least one row of actuation elements. A plurality of rows of actuation elements can be employed, here preferably with a mirror element provided for at least one actuation element in at least one actuation element row or at least one of the actuation element rows being provided with a row of interconnected mirror elements.

In one scenario, the mirror gap can be further selected to maintain a substantial planarity of the mirror element deflection region during stable displacement of a corresponding actuation region. The mirror gap selection further can be made to maintain a substantial parallelism of a planar mirror element deflection region with the substrate during the corresponding actuation region's stable displacement.

Preferably, the optically reflecting upper surface of at least one mirror element in a row of mirror elements is characterized by a substantial planarity as a corresponding mirror deflection region is deflected through the mirror gap. This planar, optically reflecting upper surface can for some applications also preferably be maintained parallel with the substrate as a corresponding mirror deflection region is deflected through the mirror gap; additionally or alternatively, the planar optically reflecting upper surface can be maintained parallel with that of at least one other mirror element provided for another row of actuation elements, and can be provided as parallel with the optically reflecting upper surface of all other mirror elements.

For each actuation element there can be defined an actuation element deflection region that is free to be deflected through the actuation gap. Here the actuation region extends from about the actuation support region to the actuation element deflection region. A commonality in area between the actuation region and a corresponding stationary electrode is preferably here selected to produce controlled and stable displacement of the actuation element deflection region over a displacement range extending to the specified point in the actuation gap.

The substrate of the diffraction grating can be provided as, e.g., silicon, or other suitable material; an insulating surface layer can be provided on the substrate. The electrodes, as well as the actuation elements and the mirror elements, can all be provided as polycrystalline silicon. The optically reflecting upper surface of the mirror elements can be provided as a gold layer.

The diffraction grating can be employed for a wide range of applications requiring the ability to diffract an incoming beam of light, particularly optical applications. The elements of the grating outlined above define an electrostatically-controllable actuator that can in one embodiment be generally described as having a stationary electrode and an actuation element that is separated from the stationary electrode by an actuation gap. The actuation element includes a mechanically constrained actuation support region and a conducting actuation region connected to the actuation support region and free to be deflected through the actuation gap.

An auxiliary element is provided, separated from the actuation element by an auxiliary gap. The auxiliary element includes a mechanically constrained auxiliary support region that is connected to the actuation element, and further includes a deflection region that is connected to the auxiliary support region and is free to be deflected through the auxiliary gap. The auxiliary gap is selected to be less than the actuation gap. With this consideration, the auxiliary gap is selected to produce controlled and stable displacement of the actuation region over a displacement range extending to a specified point in the actuation gap when an actuation voltage is applied between the actuation region and the stationary electrode. The auxiliary gap is further selected to maintain a substantial planarity and parallelism of the auxiliary element deflection region with the stationary electrode during stable displacement of the actuation region. Preferably the auxiliary element includes a horizontal upper surface that is characterized by a substantial planarity that is maintained as the actuation region is displaced.

The actuation element can be defined to include an actuation element deflection region that is free to be deflected through the actuation gap. Here the actuation region extends from about the actuation support region to the actuation element deflection region. A commonality in area between the actuation region and the stationary electrode is selected to produce controlled and stable displacement of the actuation element deflection region over a displacement range extending to the specified point in the actuation gap.

Other applications, features, and advantages of the invention will be apparent from the following description and associated drawings, and from the claims.

BRIEF DESCRIPTION OF THE DRAWINGS

FIGS. 17A–B are schematic side-view diagrams of an example configuration of a double cantilever electrostatic actuation configuration provided by the invention, without and with an applied actuation voltage, respectively;

FIGS. 19A–B are schematic top-down and side-view diagrams of a second example electrostatically-actuated plate configuration provided by the invention;

DETAILED DESCRIPTION OF THE INVENTION

Figure 1A:
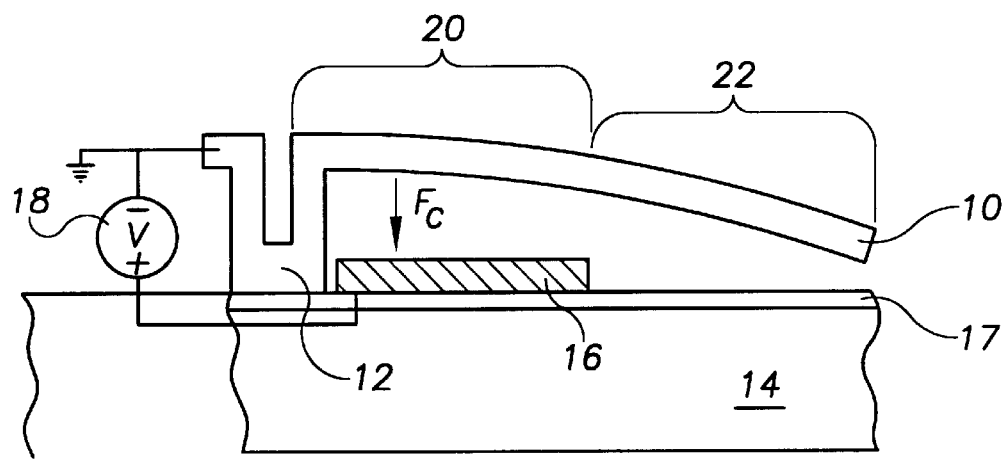
FIGS. 1A and 1B are schematic side-view diagrams of an example electrostatically-actuated cantilever beam and doubly-supported beam, respectively, that implement the leveraged bending action of the invention.

To illustrate the factors related to electrostatic pull-in instability, consider an ideal electrostatic system consisting of two parallel, electrically conducting, rigid plates. An initial separation gap, $g_0$, is provided between the plates; one of the plates is fixed while the other plate is partially mechanically restrained but can move a variable distance, $z$, through the gap toward the fixed plate. When a voltage, $V$, is applied between the two plates, the resulting electric field produces an attractive force between the plates. If fringing fields are neglected by assuming that the plate area is much larger than the separation distance, then the laws of electrostatics prescribe the resulting electrostatic force between the plates, $F_e$, as:

$$F_e = \frac{\varepsilon_0 A V^2}{2(g_0 - z)^2}; \quad (1)$$

where $A$ is the common surface area between the conducting plates and $\varepsilon_0$ is the permittivity of free space. Expression (1) points out that the electrostatic force is highly nonlinear, as it depends on the inverse of the square of the plate separation distance.

For most electrostatic actuator configurations, Hooke's law can be employed to model the mechanical elastic restoring force, $F_m$, of the partially restrained, moveable plate as:

$$F_m = -R \cdot z; \quad (2)$$

where $R$ is the spring constant characteristic of the restraint of the moveable plate structure. Expression (2) points out that the mechanical restoring force linearly depends on the plate separation distance.

As a result of these opposing electrostatic and mechanical forces, as the voltage applied between the plates is increased from zero, the stable equilibrium position for the moveable plate decreases from the full gap, $g_0$, to some fraction of the full gap. Then at some critical value of applied voltage characteristic of the plate configuration, a bifurcation in the system dynamics occurs such that above the critical voltage, no stable plate position exists in the gap. This critical voltage, the pull-in voltage, $V_{p1}$, is given, based on expressions (1) and (2) above, as:

$$V_{Pl} = \sqrt{\frac{8k g_0^3}{27 \varepsilon_0 A}}. \quad (3)$$

Application of this pull-in voltage, $V_{p1}$, results in a plate separation, that is ⅔ of the initial gap distance. At voltages below this pull-in voltage, as the voltage is increased from zero the moveable plate stably moves toward the fixed plate until the separation between the plates is ⅔ the original separation. Then at that plate separation, the moveable plate unstably collapses its position to that of the fixed plate. This unstable collapse in position is a result of a positive feedback mechanism that is inherent in the electrostatic force generation mechanism. As the moveable plate moves closer to the fixed plate, an increasing amount of electrical charge is drawn onto the plate to increase the electric field and maintain the potential difference between the plates. This electric field increase in turn increases the electrostatic force between the plates, causing the moveable plate to continue proceeding closer to the fixed plate. To maintain stable positioning of the moveable plate, it is thus required to restrict its movement to no more than ⅓ of the original gap between the plates. This is true in general for conventional electrostatically-actuated structures; movement of the actuated region of the structure must be limited to no more than ⅓ of the original actuation separation gap to maintain stable positioning of the actuated region.

The invention provides structural configurations for electrostatic actuators that enable a range of stable actuation motion beyond the conventional ⅓ of the original actuation separation gap. FIG. 1A is a schematic side-view diagram of a first example actuation configuration provided by the invention. As shown in the figure, a cantilever beam 10 is supported by a support post 12 enabling the beam to be suspended over a substrate 14. In this example configuration the cantilever is electrically conducting and is set at electrical ground. A conducting electrode 16 is provided on the substrate under a portion of the cantilever. The substrate may be either electrically insulating or electrically conducting. If it is electrically conducting, it too is set at electrical ground, and the electrode 16 is electrically insulated from the conducting substrate by insulating layer 17, as shown in the example structure of FIG. 1A. If the substrate is insulating, then there is no requirement for an insulating layer underlying the conducting electrode.

The electrode 16 extends from a point at or near to the cantilever support 12 to an intermediate point along the cantilever length. An actuating voltage, V, 18 is applied between the cantilever 10 and the electrode 16. With this configuration, the cantilever is segmented into an actuation region 20, extending from a support region, here the support post, to the end of the lower electrode, and a deflection region 22 that is not suspended over the lower electrode and thus which shares no common area with the lower electrode.

When the actuating voltage is applied between the cantilever and the lower electrode, the actuation region 20 of the cantilever is subjected to a downward electrostatic force, $F_e$, as shown in the figure, tending to pull that region of the cantilever toward the lower electrode. As the actuation region moves downward, it applies leverage on the deflection region 22 of the beam. The deflection region then in turn bends toward the substrate under this levering action.

The cantilever support 12 neighboring the actuation region acts to mechanically restrain the actuation region. This increases the pull-in voltage and pull-in position for the beam above that of a conventional beam employing an electrode extending the full length of the beam. The deflection region, not being mechanically restrained and not being electrostatically actuated, can bend through a travel range that is larger than the pull-in limit for the corresponding conventional beam, and that can reach the entire gap distance before the pull-in condition for the actuation region of the beam occurs, for selected design choices described below. The leveraged bending configuration provided by the invention thereby extends the stable travel range of the beam beyond that attainable for the corresponding conventional beam-electrode configuration, and with selected design choices, enables stable travel through the full gap before the pull-in instability condition is met. The application of electrostatic force not to the deflection region but instead to the adjacent actuation region, which is provided with mechanical restraint by the neighboring support posts, enables this condition.

Note again that because the deflection region shares no common area with the lower actuating electrode, this region is not directly subjected to a pull-in instability condition and thus, unlike the actuation region, can be stably positioned at any point in the gap so long as pull-in of the actuation regions have not occurred. The support post design can in turn be selected to ensure that the actuation region is not deflected beyond its stable travel range for a selected deflection region travel range. With this arrangement, no region of the entire cantilever beam is subject to a pull-in instability during actuator operation.

Figure 1B:
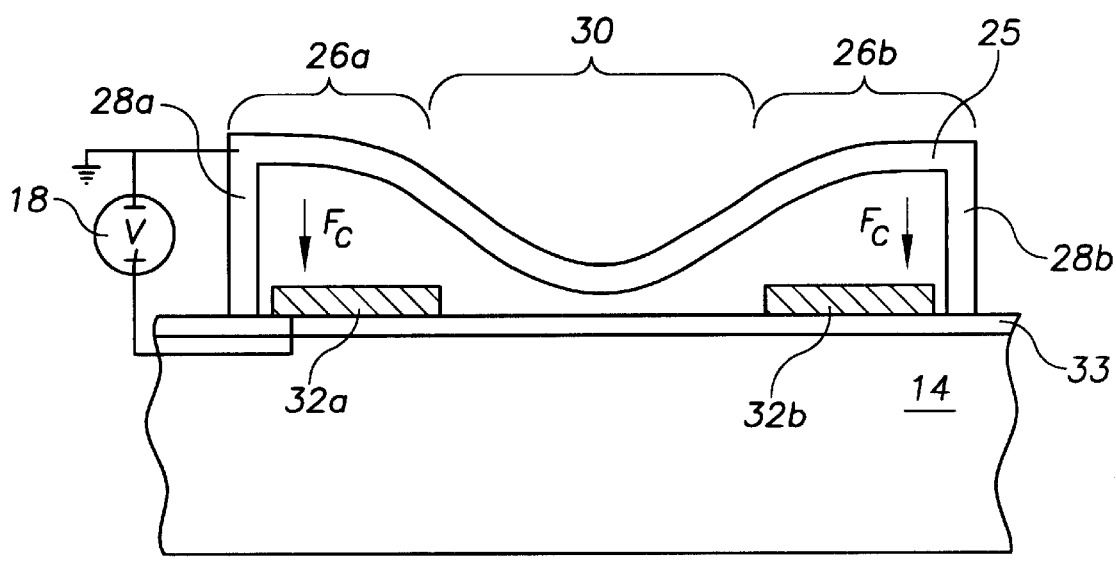

FIG. 1B is a schematic side-view diagram of a doubly-supported beam 25 provided by the invention for producing leveraged bending of a portion of the beam through a travel range that is larger than the pull-in limit characteristic of the corresponding conventional beam-electrode configuration. As shown in the figure, the beam includes two actuation regions 26a, 26b, neighboring corresponding beam supports 28a, 28b, respectively. A deflection region 30 is located between the actuation regions, central to the beam. Each actuation region is suspended over a corresponding electrically conducting electrode 32a, 32b. Assuming that the substrate is also electrically conducting, the electrodes are electrically isolated from the substrate by an insulating layer 33 and the substrate is set at electrical ground. The beam is in this example also electrically conducting and set at electrical ground. An actuating voltage V, 18 is applied between each conducting electrode and the beam. Only one of these connections, to a first of the electrodes 32a, is shown in the figure, for clarity.

Upon application of the actuation voltage, the actuation regions 26a, 26b are subjected to a downward electrostatic force, $F_e$, and in response, tend to move downward toward the lower electrodes. This causes bending of the deflection region 30 due to leverage applied by the actuation regions on the deflection region. In the manner of the deflection region of the cantilever beam of FIG. 1A, the deflection region here can travel beyond the pull-in travel limit that is characteristic of the corresponding conventional structure employing an electrode extending the length of the beam because the deflection region is not subjected to electrostatic forces and because the actuation regions are mechanically reinforced by the support posts. For selected design choices, as discussed below, the center of the beam can be stably bent through the entire gap between the beam and the substrate, based on the characteristic shape of the beam. This enables elimination of the electrostatic pull-in instability across the entire beam length while up to full gap travel of the deflection region is achieved.

In accordance with the invention, to obtain a desired travel range for a selected actuator structure geometry and material configuration, the extent and position of one or more actuation regions of the actuator structure are prescribed. Specifically, for each actuation region there is to be determined a commonality in area between that actuation region and a corresponding stationary actuation electrode that results in a desired displacement of the deflection region over a displacement range. Note that each actuation region and its corresponding stationary electrode may be of different areas; it is not the specific area of each, but the commonality of area between the two, i.e., that area which is common to the actuation region and a stationary electrode across the actuation gap, that determines the actuation characteristics.

For example, for the doubly-clamped beam of FIG. 1B, this specification can be accomplished by modeling the two-dimensional electrical-mechanical equilibrium function for an elastic beam as:

$$\frac{d^2}{dx^2}\left[EI\frac{d^2z}{dx^2}\right] - S[z(x)]\frac{d^2z}{dx^2} = F_e = \frac{\varepsilon_0 a(x)V^2}{2(g_0-z)^2}; \quad (4)$$

where x is the distance along the beam length; z(x) is the displacement of the beam from its initial position, a distance $g_0$ above the substrate, as a function of distance x along the beam; E is the elastic modulus of the beam material; I is the moment of inertia of the beam, S[z(x)] is the tensile force in the beam due to stress, as a function of beam displacement and distance, x, along the beam; $F_e$ is the electrostatic force per unit length; V is the applied voltage; and a(x) is the width, or profile, of actuation regions as a function of distance along beam length.

This expression neglects fringing fields. For the doubly-clamped beam of FIG. 1B, the moment of inertia of the beam, I, is given as:

$$I = \frac{wt^3}{12}; \quad (5)$$

where w is the width of the beam and t is the thickness of the beam.

The tensile force, S[z(x)], can be modeled as:

$$s[z(x)] = tw\left[\sigma_0 + \frac{E}{2L}\int_0^L \left(\frac{dz}{dx}\right)^2\right]; \quad (6)$$

where $\sigma_0$ is the axial residual stress in the beam as-fabricated, after its release, L is the length of the beam, and the integral term takes into account the added strain-induced stress produced by the elongation of the beam as it deflects. Expressions (4) and (6) can be solved by employing boundary conditions for the beam that correspond to the specific support structure selected for the beam. The examples presented below assume that the ends of the beam have perfectly clamped boundary conditions.

For identical beam and actuation electrode widths, every term in expression (4) is proportional to the beam width. Hence the calculated design parameters for electrostatic actuation of this arrangement are independent of beam width, provided that the beam width is relatively small compared to the beam length. Expression (4) can then be employed as a sufficiently accurate model, particularly where the beam width is much less than the beam length and the width is sufficiently large so that fringing fields can be neglected, as is typical where the width is much greater than the initial separation $g_0$. If electrode widths smaller than the beam width are to be employed, or if the beam itself is not uniform in width, then the results will depend on the relative widths of the various structural regions in ways that are readily found from numerical solution of the governing equations.

With these expressions and appropriate considerations for their accuracy in modeling beam geometry, the profile and extent of actuation regions along the beam length can be determined as a(x) for a prespecified stable travel range of one or more deflection regions. Given the nonlinearity of the expressions, it can be preferred to solve the expressions by employing numerical methods, such as a finite-difference simulation, enabled by software such as, e.g., MATLAB numerical software from MathWorks, Inc., of Natick, MA. When the desired travel range of the deflection region or regions is set equal to the full gap extent, the resulting a(x) actuation region profiles enable stable, full-gap leveraged bending. More specifically, the resulting a(x) function sets the profiles and extent of actuation regions that support a stable deformation profile of the deflection region at all points in the gap. Correspondingly, if less than full-gap travel is desired, the actuation region profiles can be numerically determined to produce a stable deformation profile of the deflection region for all points in the selected range of travel. Quantitative examples of this design analysis are provided below.

The effectiveness of the leveraged bending action enabled by the invention is directly impacted by the nature of an actuator's mechanical restoring force, including its bending characteristics. For example, for the doubly-supported beam of FIG. 1B, the three sources of the beam's mechanical restoring force—bending, residual stress, and strain-induced stress, all impact leveraged bending of the beam's deflection region. These effects can be quantified with a model for each component of the restoring force, e.g., that determines the displacement, and corresponding beam stiffness, resulting from application of a load to the doubly-supported beam, based on one of the components of interest, i.e., ignoring effects of the other force components.

Considering first residual stress, it is found that the leveraged bending action of the invention is very sensitive to residual tensile stress in an actuator beam. A beam deflection region that is characterized by high tensile stress responds to applied leverage like a rubber band. When an electrostatic force is applied near to the beam supports, the central, deflection region of the beam remains flat, reducing the travel range through which the lever effect can bend the region. In contrast, compressive residual stress in the beam does not compete with the lever effect and thus can be accommodated.

It is found that preferably, to maximize the effectiveness of the leveraged bending action of the invention, a good rule of thumb is that the bending stiffness of the beam should be at least about twice the stiffness that is due to tensile residual stress. For the doubly-supported beam of FIG. 1B, with two symmetrically placed actuation electrodes of equal length, $L_1$, this consideration can be modeled with the assumption that a uniform load is applied over the actuation regions of the beam. This results in a prescription for the allowable tensile residual stress, $\sigma_0$, as:

$$\sigma_0 < \frac{Et^2}{2L_1(L-L_1)}; \quad (7)$$

where E is the elastic modulus of the beam, t is the thickness of the beam, $L_1$ is the length of each actuation region, and L is the beam length. This expression indicates that thicker, shorter beams and shorter actuation regions tend to increase the level of tensile residual stress that can be tolerated while enabling leveraged bending action of a central beam deflection region.

Figure 2:
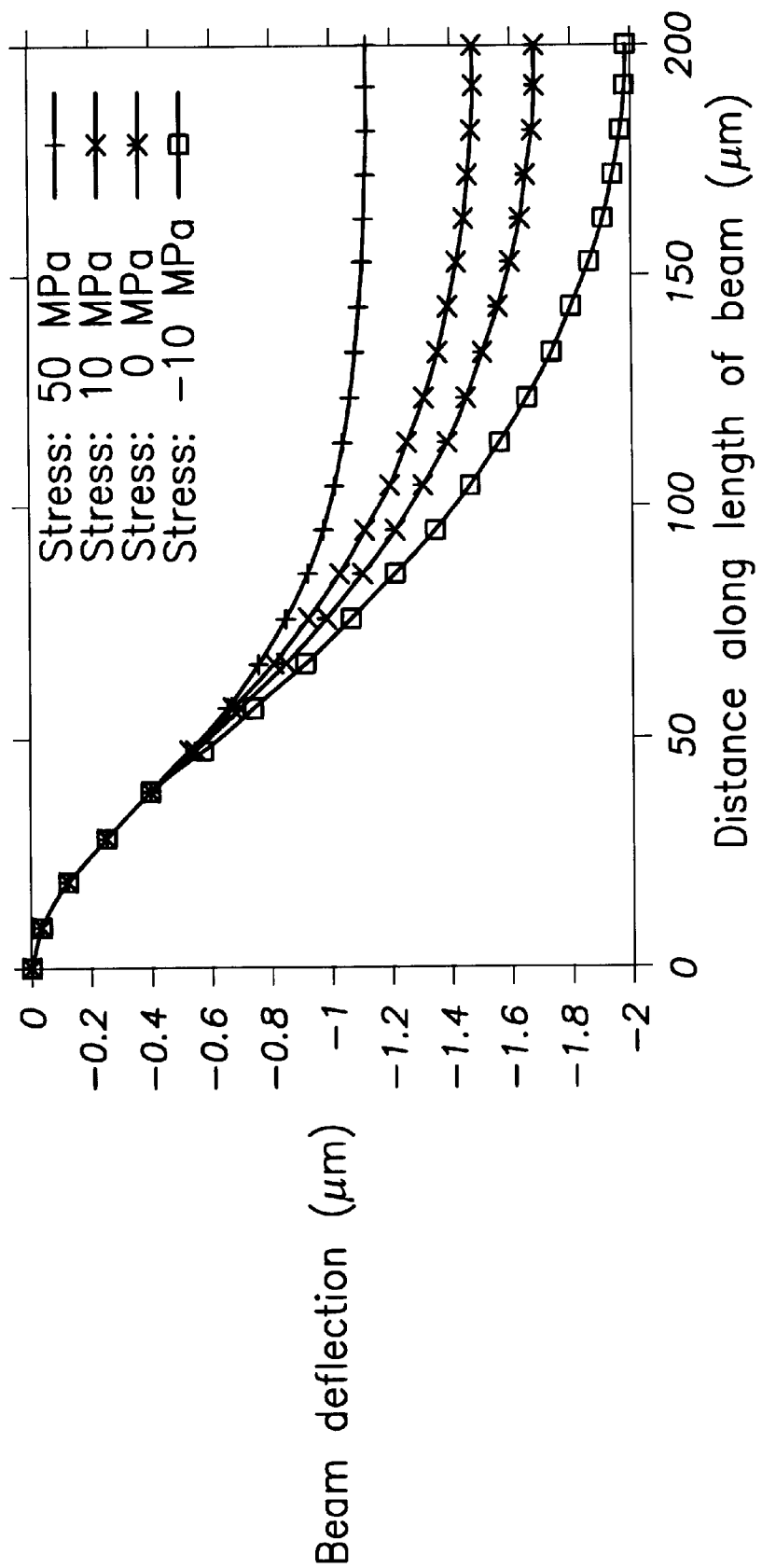
FIG. 2 is a plot of simulation data for beam deflection as a function of beam length for various beam stress levels, for the beam of FIG. 1B.

FIG. 2 is a plot produced by a finite difference simulation of deflection of a doubly-supported beam as a function of distance along the beam for various levels of tensile residual stress, for zero residual stress, and for compressive residual stress, all for a polysilicon beam of 2 µm in thickness, 400 µm in length, suspended by 2 µm over separated actuation electrodes each of length 80 µm. The plot highlights the condition that the maximum stable travel distance that can be achieved for the central beam deflection region decreases with increasing tensile residual stress.

The preceding expressions can also be employed to produce a prescription for allowable strain-induced stress in an electrostatically-actuated structure for which leveraged bending is to be carried out. Assuming a maximum strain to determine strain-induced stress, it is found that the factors governing a condition where leveraged bending is not significantly affected by strain-induced stress can be prescribed as:

$$\frac{t}{g_0} > \frac{16L_1(L-L_1)}{3L^2}. \quad (8)$$

This indicates that for a typical range of beam and actuation electrode lengths, it is preferred that the beam thickness, t, be close to or larger than the initial separation gap to minimize effects of strain-induced stress on leveraged bending.

It is to be recognized that this analysis of conditions opposing the leveraged bending effect are preferably employed in concert with a design process that enables specification of actuation region geometry based on the expression (4) given above. In an example of such a design process for a doubly-supported beam, it is preferred to a priori select the desired travel range of the deflection region of the beam. The beam thickness and the suspension gap height under the beam may, for many applications, be set by the specifications of the process employed to fabricate the beam, but preferably are considered to provide the desired travel range and to address mechanical restoring force and voltage level conditions, respectively. Specifically, the fabricated gap should obviously be at least as large as the desired travel range. The beam should be thick enough to oppose strain-induced stress sufficiently to enable leveraged bending, but thin enough to be actuated at voltage levels that are reasonable for a given application. The beam length is preferably selected based on fabrication considerations, given that actuation voltage decreases and travel range increases with increasing beam length.

In order to estimate the voltage range required to achieve desired range of actuation travel, one can express a relationship between the maximum displacement, z to be produced at the center of the beam, assuming a symmetrically-actuated beam and a uniform distributed force, q, as:

$$q = C_1 \frac{\sigma_0 t}{L^2} z + C_2 \frac{Et^3}{L^4} z + C_3 \frac{Et}{L^4} z^3; \qquad (9)$$

where $C_1$, $C_2$, and $C_3$, are numerical constants whose values are readily obtained from numerical solution of expression (4). The first term of expression (9) describes the stiffness of the beam due to residual stress, the second term describes the stiffness of the beam due to bending as it is actuated, and the third term describes the stiffness that is added to the beam as it bends, due to strain-induced stress. The ratio qA/z can then be understood as an effective spring constant for the structure, which is nonlinear, being dependent on the maximum displacement, z.

Substitution of the effective spring constant, qA/z, into expression (3) prescribes an estimate of the pull-in voltage for a conventional structure in which the actuation electrodes are disposed beneath the entire beam. As explained above, the pull-in voltage for the leveraged bending structure of the invention is larger than the pull-in voltage for a corresponding conventional structure, and depends in detail on the actuation electrode length. Specifically, the pull-in voltage of the leveraged bending structure of the invention generally increases as the actuation electrodes are made shorter. The pull-in voltage estimate that can be obtained from expression (3) for a conventional full-electrode structure is useful, however, for comparing the range of voltages that would be required to actuate beam designs of varying geometry. In addition, the pull-in voltage for a conventional structure that is prescribed by expression (3), corresponds to a minimum pull-in voltage for a corresponding leveraged bending actuation structure of the invention, and can be used to estimate the larger pull-in voltage to be expected for the leverage bending structure.

Figure 3:
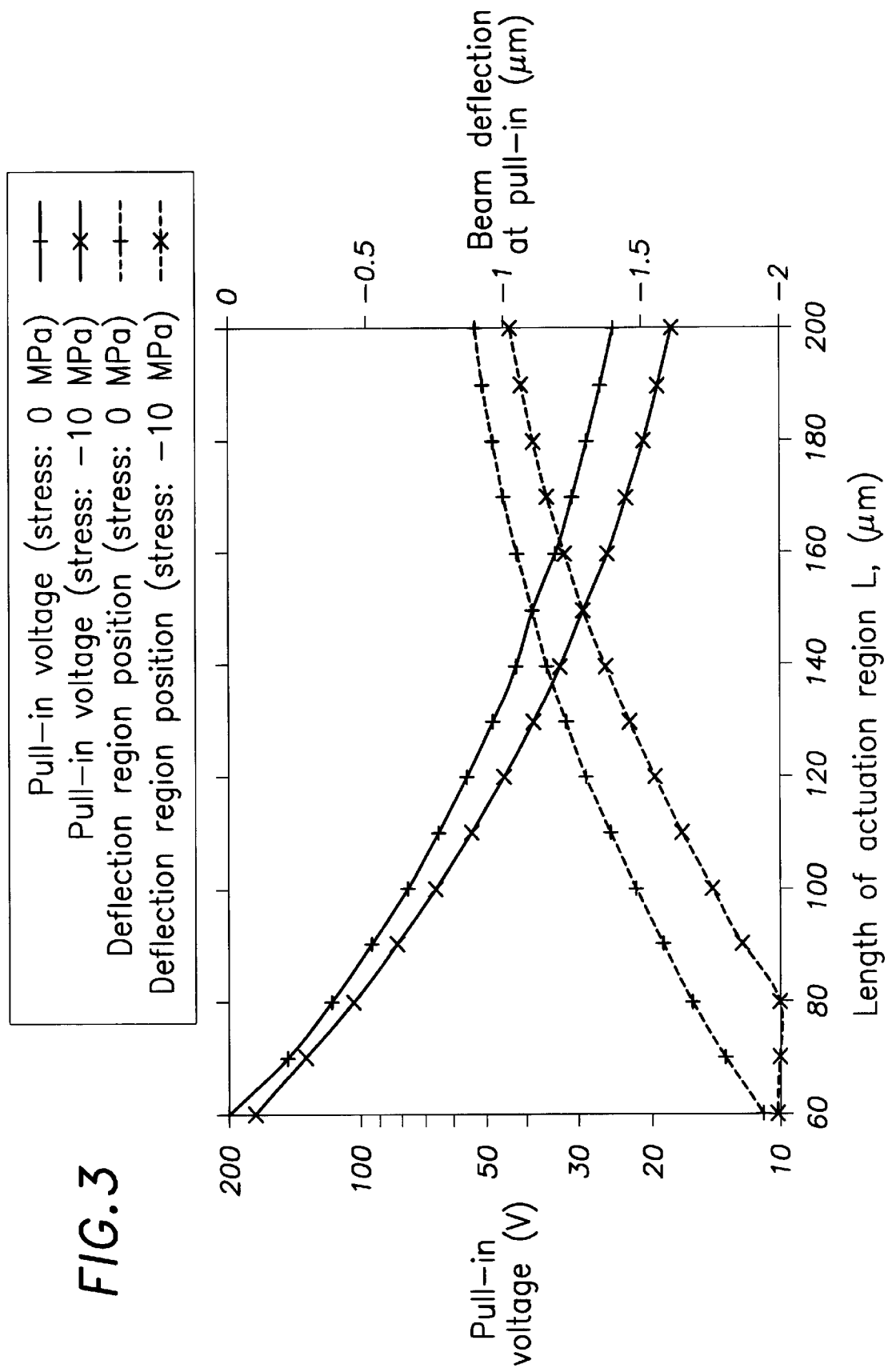
FIG. 3 is a plot of simulation data for pull-in voltage and for beam deflection at pull-in, both as a function of length of beam actuation region, for various beam stress levels, for the beam of FIG. 1B.

With selections for gap height, beam thickness, and beam length, the actuation region length, $L_1$ can be selected from evaluation of expression (4). FIG. 3 is a plot produced by a finite-difference simulation illustrating the tradeoff between actuation voltage and stable deflection region travel range for various actuation region lengths. This simulation assumes a doubly-supported polysilicon beam geometry where the beam thickness is 2 μm, the beam length is 400 μm, and the gap is 2 μm. Two different stress levels, namely zero stress and compressive stress of −10 MPa, are assumed.

The plotted curves that extend from the upper left to the lower right of the plot indicate the pull-in voltage of the leveraged bending structure, as given on the left axis of the plot, namely, that voltage which produces the maximum stable travel of the beam deflection region of the structure. It is evident that the pull-in voltage is reduced for larger actuation region lengths. The plotted curves that extend from the lower left to the upper right of the plot indicate the maximum extent of stable deflection region travel at the occurrence of pull-in, as given on the right axis of plot. It is seen that shorter actuation lengths allow greater stable travel of the deflection region.

For this example, an actuation length of about 80 μm and a compressive residual beam stress of about −10 MPa is found to enable full-range travel through the 2 μm gap while minimizing required actuation voltage. The full-gap actuation requires an applied voltage of about 108 V, which is about 6.1 times higher than the pull-in voltage of an electrostatic actuator not employing leveraged bending action. It is to be recognized, however, that the ratio of full-gap leveraged bending voltage to full-gap pull-in voltage varies significantly based on specific geometric actuator features.

Figure 4:
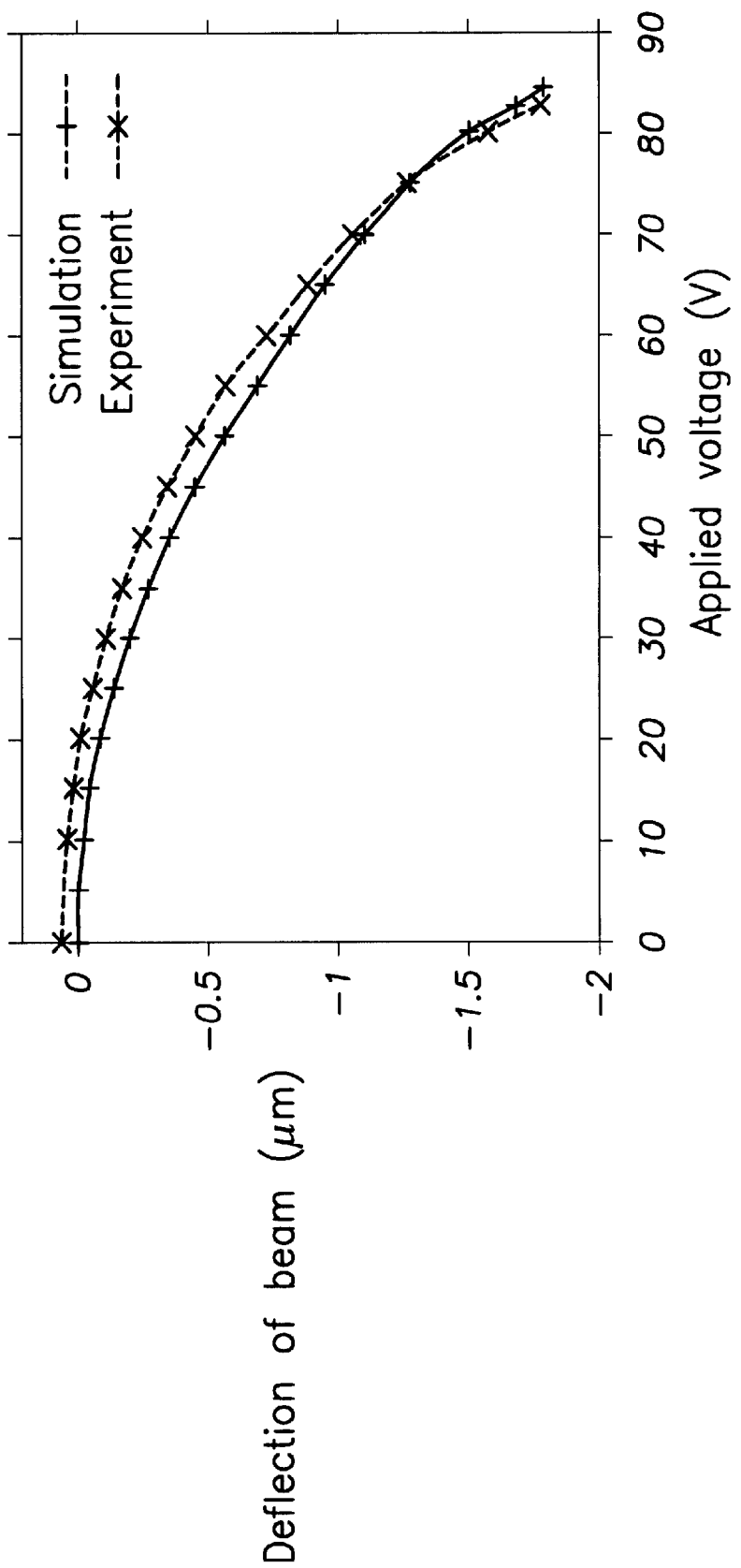
FIG. 4 is a plot of simulation and experimental data for beam deflection as a function of applied voltage, for the beam of FIG. 1B.

FIG. 4 presents plotted simulation results for beam deflection as a function of applied actuation voltage for the beam parameters specified just above and further presents experimentally measured beam deflection as a function of applied actuation voltage for a polysilicon beam fabricated to the given beam specifications, with a beam width of 12 μm. For these measurements, beam thickness and deflection region position were experimentally determined using a WYKO interferometric profilometer. It was found that at least about 1.75 μm of travel out of the 2 μm gap was achieved for the fabricated structure. The small discrepancy between the simulation and measured data may be due to unmodeled compliance in the beam support posts. Aside from this small discrepancy, it is found that the simulated and measured data agree well, indicating that the example design process specified above is a valid one.

Figure 5:
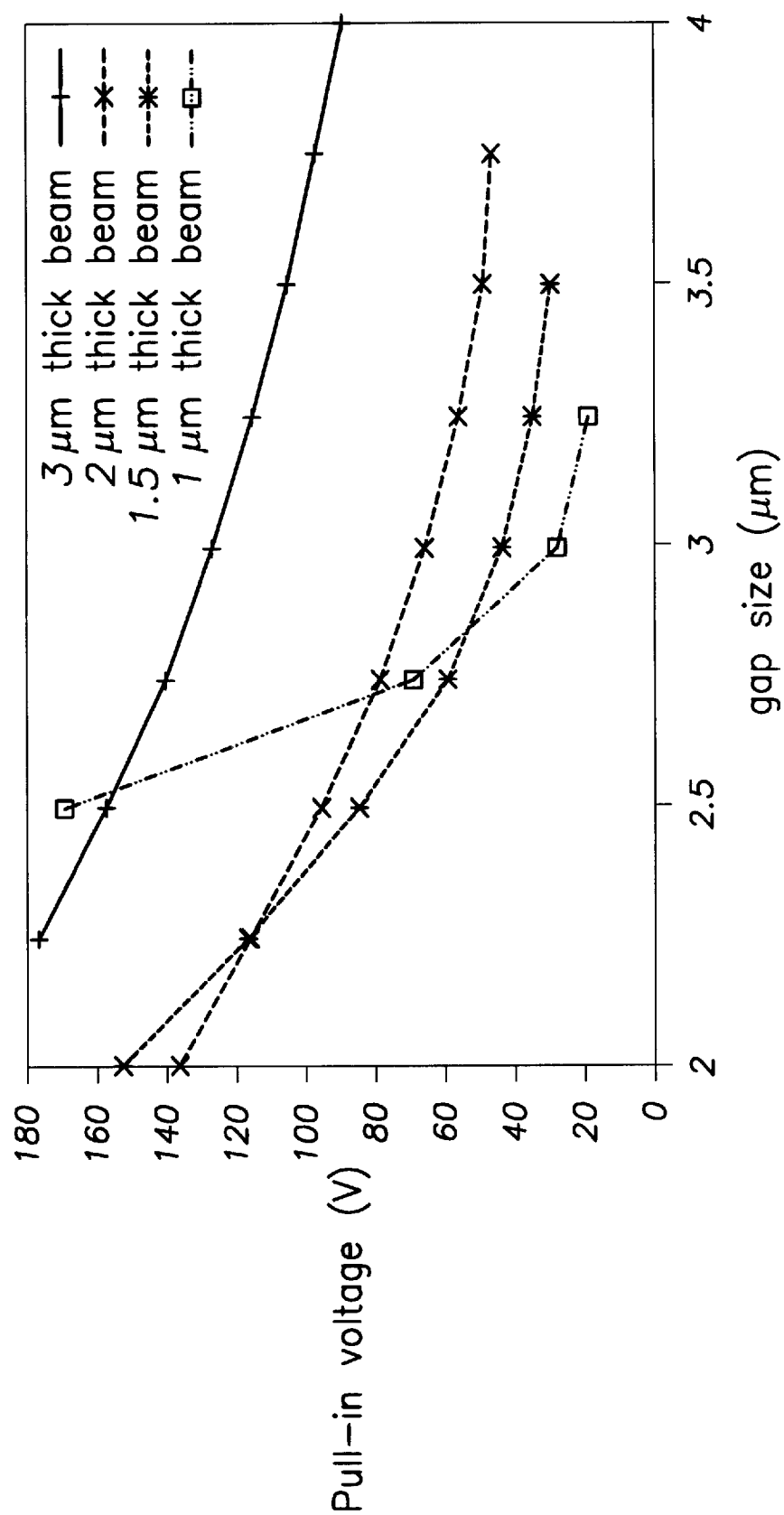
FIG. 5 is a plot of simulation data for pull-in voltage as a function of gap size, for various beam thicknesses, for the beam of FIG. 1B.

FIG. 5 is a plot of simulated data produced to demonstrate the dependence of actuation voltage on gap height for beams of 1 μm, 1.5 μm, 2 μm, and 3 μm in thickness. For each gap size, an actuation region length was selected that would correspond to a 2 μm stable travel range for the beam deflection region. For all simulated data, a beam length of 500 μm and zero residual stress were assumed.

As indicted by the plotted data, for smaller gap heights, shorter actuation regions are necessary to achieve the desired 2 μm travel range, and this necessitates correspondingly larger actuation voltages. For smaller beam thicknesses, there is a dramatic decrease in required actuation voltage for higher gap sizes, particularly for beam thicknesses that are less than the 2 μm travel range. This is an illustration of the strain-induced stress effects discussed above. For the smaller beam thicknesses, strain-induced stress is dominant, and the leveraged bending effect is sharply reduced; the point at which this condition occurs corresponds in the plot to that point where a sharp change in actuation voltage occurs for the thinner beams. Thus for thinner beams, it is not possible in practice to achieve a 2 μm travel range with a 2 μm gap employing leveraged bending. Thicker beams can, however, employ the leveraged bending action to achieve a 2 μm travel distance through a 2 μm gap.

The invention contemplates a wide range of structural adaptations to electrostatic actuator configurations for enabling particular operational requirements. For example, referring to FIG. 6A, there is shown a top-down schematic diagram of a doubly-supported electrostatically-actuated beam having a profile that varies as a function of length; this configuration enables an increase in effectiveness of leveraged bending action in combination with a decrease in required actuation voltage. As shown in the figure, the beam includes two support posts 42a, 42b, each of which neighbor a corresponding actuation region 44a, 44b, respectively, each of a common length, $L_1$. Conducting electrodes, also of length $L_1$, are located under each actuation region.

A central deflection region 46 is provided with a varying profile; at its ends, the deflection region is of a first width, $w_1$, while at its center, the deflection region is of a second, more narrow width, $w_2$. Each end of the beam thereby provides a wider-profile region of length $L_2$ that includes an entire actuation region and a portion of the deflection region. By providing the deflection region with end portions that have a wider, more stiff profile, leveraged bending of the deflection region is enhanced. The narrow, more compliant central portion of the deflection region acts both to lower the required actuation voltage and to increase the beam travel range due to the leveraged bending effect. The invention contemplates that this stiffness profile tailoring can be achieved by adjustment of other beam parameters; e.g., tailoring of beam thickness in the beam deflection region.

Figure 6A:
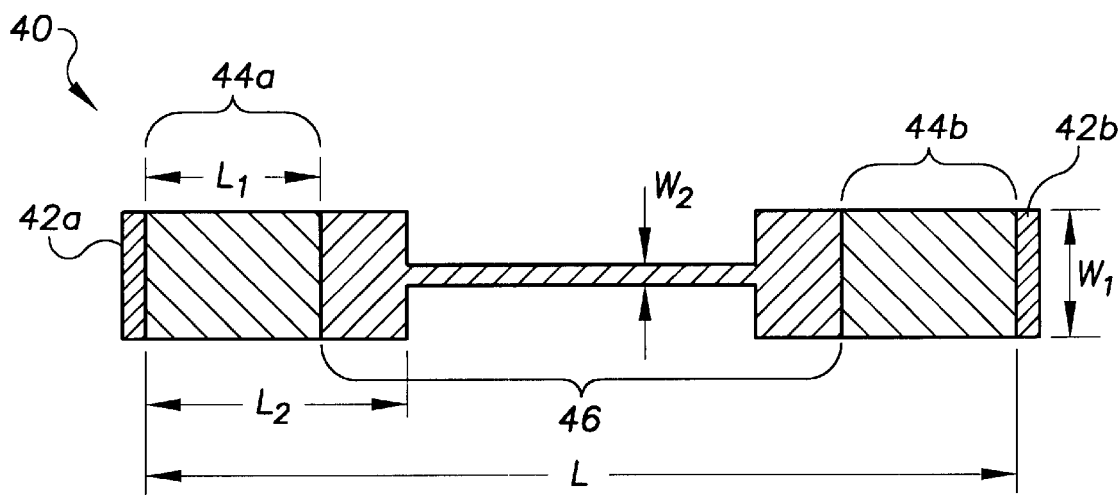
FIG. 6A is a schematic top-down diagram of an example doubly-supported beam having a width that varies as a function of length, in accordance with the invention.
Figure 7:
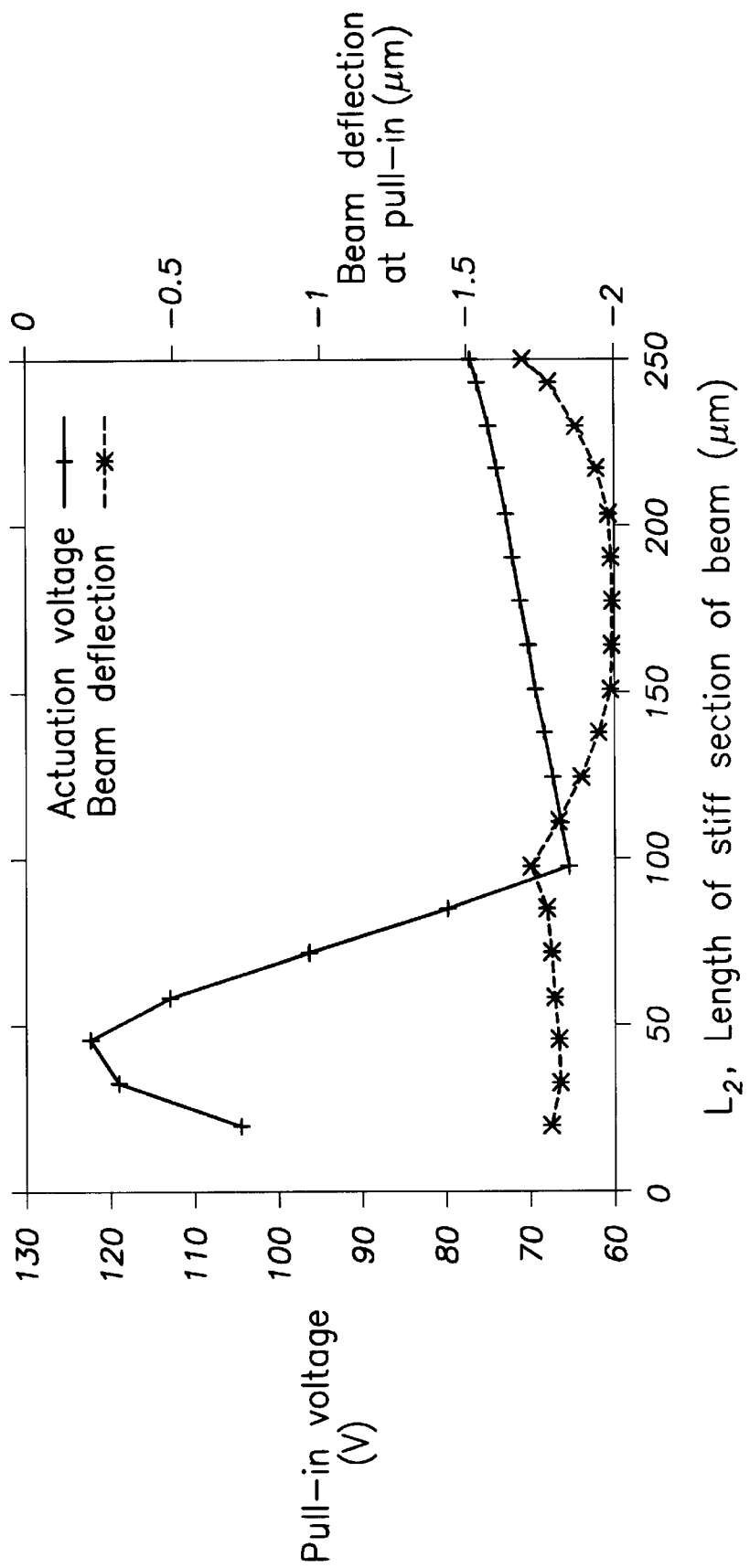
FIG. 7 is a plot of simulation data for pull-in voltage and for beam deflection at pull-in, both as a function of the length of the stiff beam section of the beam of FIG. 6A.

FIG. 7 is a plot of data produced by a simulation for determining the impact of the length of the stiff section of the beam of FIG. 6A on the beam performance. This data assumes a beam length, L, of 500 $\mu$m, a gap of 2 $\mu$m, and zero residual stress in the beam. The actuation region length, $L_1$, is set at 100 $\mu$m.

As pointed out in the plot, for wide-profile lengths less than 100 $\mu$m, an increase in the wide-profile length at first produces an increase in overall beam stiffness, but then compensates for this increase with an increased actuation force. At wide-profile lengths greater than 100 $\mu$m, the stiffness of the beam, combined with the compliance in the center of the beam deflection region, increases the effect of the leveraged bending action. A wide-profile length of about 150 $\mu$m enables leveraged bending through the entire 2 $\mu$m gap with an applied voltage of about 69 V. This compares with a voltage of about 137 V required to achieve the same full-gap leveraged bending for a corresponding doubly-supported beam with a uniform profile. This example illustrates that the leveraged bending action provided by the invention can be adapted to meet various design and operational criteria.

This also illustrates that the leveraged bending action provided by the invention can be incorporated into a wide range of electrostatically-actuated structures. For example, the features employed for producing electrostatic actuation can be provided in any convenient configuration. The actuated structure can be uniformly conducting, like the structures of FIGS. 1A–1B, with actuation electrodes located below the structure on an electrically insulated substrate, or the substrate can be uniformly conducting, here the structure being provided as segmented electrically conducting regions on an electrically insulating structure. Alternatively, both the structure and the substrate can be electrically insulating, with conductors provided on each at the appropriate locations corresponding to the structure's actuation regions.

For many applications, it can be preferred to include topology on the lower face of the deflection region to inhibit stiction of the deflection region to a lower substrate when the deflection region travels through the complete gap to contact the substrate. Topology can further be included on the upper face of the entire structure, as-desired for a given application, and perforations or other geometric features can be included along the structure. As demonstrated just above, the structure width and/or thickness can vary along its length, and can be tailored for communicating with external mechanisms.

Figure 6B:
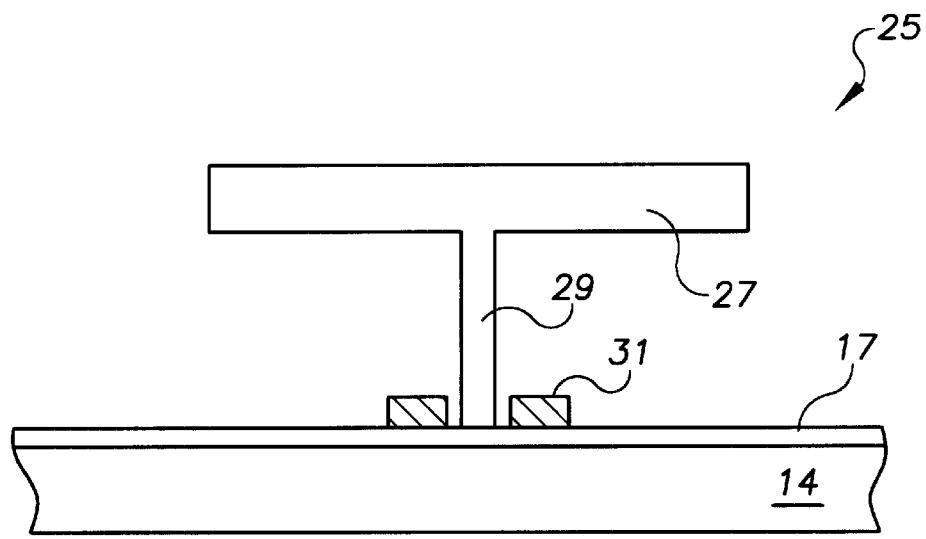
FIGS. 6B–6C are schematic side-view diagrams of example electrostatically-actuated plate configurations, employing a central actuation electrode, and a peripheral actuation electrode, respectively, that implement the leveraged bending action of the invention.

Thus, the leveraged bending action of the invention can be incorporated into the operation of cantilever beams, doubly-supported or multiply-supported beams, plates, diaphragms, or other suspended structure. For example, referring to FIG. 6B, there is shown a schematic cross-sectional diagram of a configuration 25 in which a conducting plate 27 is supported over an insulated substrate 14 by a central support post 29. An actuation electrode 31 is provided neighboring the support post; the electrode can be provided with an annular geometry that encircles the post, or can be provided as discrete segmented electrodes. The plate and its post can be rectangular, circular, or take on other geometry. With this configuration, the outer periphery of the plate 27 is a continuous deflection region that is displaced due to electrostatic force between the inner region of the plate and the electrodes 31.

Figure 6C:
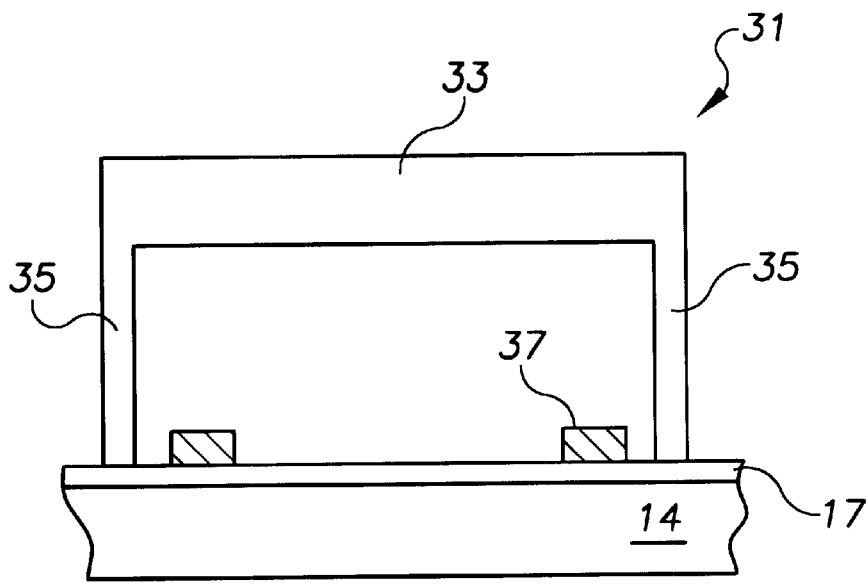

In an alternative variation 31 of this configuration, as shown in the schematic cross sectional diagram of FIG. 6C, a conducting plate 33 is suspended over an insulated substrate 14 by a support region 35 that extends at least partially around the periphery of the plate 33. An actuating electrode 37 is located on the substrate neighboring the support region. As above, the plate can take on any selected geometry, e.g., rectangular or circular, and the actuating electrode can be continuous or can be segmented around the periphery. With this configuration, the central region of the plate is a deflection region that can be displace due to electrostatic force between the periphery of the plate and the actuation electrode.

Figure 6D:
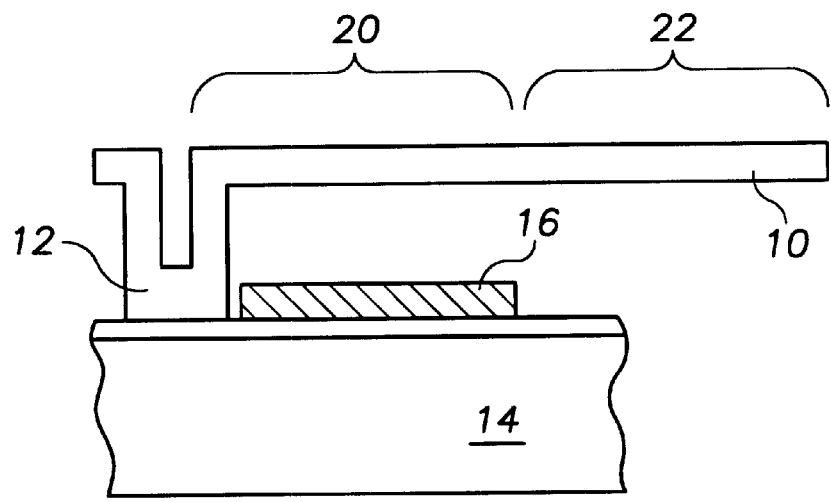
FIG. 6D is a schematic side-view diagram of an example electrostatically-actuated cantilever beam configuration provided in accordance with the invention with an extended displacement range.

It is to be noted that the leveraged bending action of the invention can be employed to displace the deflection region of a structure over a range extending beyond the gap defined between an actuation region and an actuation electrode. An example structure that implements this configuration is shown in the schematic side-view diagram of FIG. 6D. Here a cantilever beam 10 is supported by a support post 12 over an insulated substrate 14. Commonality in area between the beam and an actuation electrode 16 defines an actuation region 20 of the beam. A deflection region 22 of the beam extends from the actuation region to the end of the beam. The substrate 14 does not, however, extend to the end of the beam; instead, an end portion of the deflection region overhangs the substrate and thereby can deflect beyond the substrate. Accordingly, the displacement range of the deflection region can be larger than the gap defined between the beam and the actuation electrode.

In further alternatives contemplated by the invention, leveraged bending action can also be incorporated into the operation of laterally-actuated structures or other actuation gap orientations. No particular displacement orientation of the deflection region is required. No particular fabrication process is required by the invention to produce the structures; all that is required is the ability to produce a structure at least a portion of which is moveable in some manner to define a gap through which a deflection region of the moveable portion of the structure can be deflected by electrostatically-actuated leveraged bending. The support region can consist of a post, extension, or other suitable structure, and multiple support regions can be included. Similarly, multiple actuation and deflection regions can be included as-desired. The actuation region or regions need not be immediately adjacent to support regions; they must, however, be sufficiently close to the support regions such that mechanical support is provided to the actuation regions.

Figure 8A:
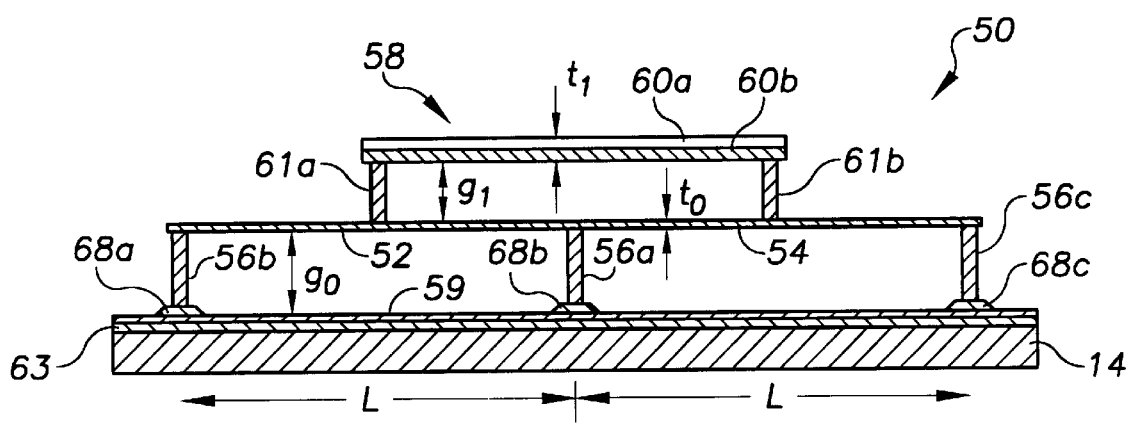
FIGS. 8A–8B are schematic side-view diagrams of a first example configuration of a double beam electrostatic actuation configuration provided by the invention, without and with an applied actuation voltage, respectively.
Figure 8B:
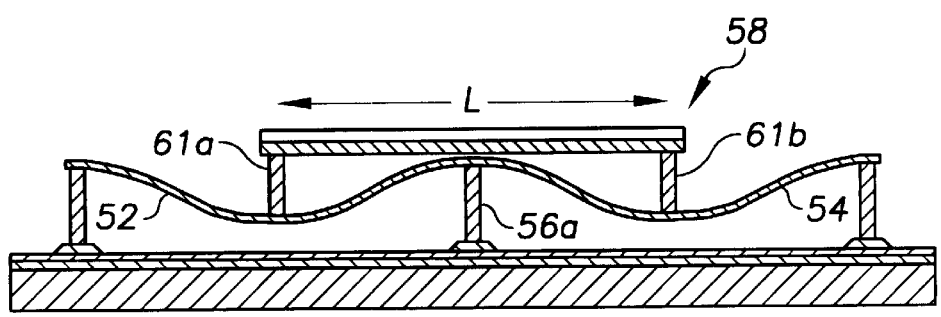

Referring to FIGS. 8A–8B, the invention provides a further actuation structure 50, shown here in a schematic side-view diagram, that is particularly well-suited for implementing leveraged bending action, and that in addition enables maintenance of planarity of a horizontal surface as the surface is stably displaced. For clarity of discussion, the structure will first be described with a configuration that does not implement leveraged bending.

As shown in the figure, there is provided on a substrate 14 two actuating beams 52, 54, each of a common length, L, and each of a common thickness, $t_0$. The two actuating beams are of an electrically conducting material and define central, conducting actuation regions that are supported over the substrate by outer actuation support regions, here provided as support posts 56a, 56b, 56c. The central support post, 56a, is shared by the two beams, but such is not required by the invention. With this support, an actuating gap, $g_0$, is defined between the actuating beams and the substrate.

An upper, auxiliary beam 58, including one or more layers 60a, 60b, of selected material that can be electrically conducting or insulating as-desired, is provided to define a central deflection region that is supported over the actuating beams 52, 54 by auxiliary support regions, here posts 61a, 61b. The auxiliary beam 56 is of a total selected thickness, $t_1$, and of a length, L, equal to the actuation beams' lengths. The auxiliary beam is suspended over the actuating beams by an auxiliary gap, $g_1$. Note that with this actuator configuration, the actuating beams' materials, lengths, thicknesses, supports, and lower actuating gap can be specified distinctly from the material, length, thickness, supports, and gap of the auxiliary beam. As a result, as explained in detail below, the operational characteristics of the actuator can be finely controlled.

A continuous, electrically conducting electrode layer 59 is provided on the surface of the substrate 14, isolated from the substrate by an insulating layer 63. The actuating beam supports each can include an insulating support base 68a, 68b, 68c, to electrically isolate the supports from the continuous electrically conducting layer 61 if the supports are formed of an electrically conducting material. If the actuating beam supports are formed of an insulating, rather than conducting material, such is not required.

Referring to FIG. 8B, when in the manner of FIG. 1B an actuating voltage, V, is applied between the actuating beams and the continuous conducting layer below the beams, with the actuating beams set at electrical ground, the central region of each actuating beam acts as an actuation region and is displaced toward the substrate. When the actuating beams have been actuated such that their actuation regions are displaced downward by an amount equal to the auxiliary gap, $g_1$, then the deflection region of the auxiliary beam 58 comes to rest on the shared actuation beam support post 56a.

Planarity is automatically maintained along the length of the deflection region of the upper auxiliary beam during this downward displacement of the actuating beams because no part of the auxiliary beam is electrostatically actuated, and because the support posts of the auxiliary beam move downward in unison on the actuation beams. Once a combined actuation-auxiliary beam structure is formed by the auxiliary beam deflection region coming to rest on the actuation beams, electrostatic actuation of the combination structure causes the actuation beams to further be displaced downward and causes the auxiliary beam to bend around the support post underlying its central region. Two distinct operational regimes are therefore provided by the structure, a first operational regime in which the auxiliary beam is moved while planarity of its deflection region is maintained, and a second operational regime in which the auxiliary beam bends with the actuation beam.

Figure 9A:
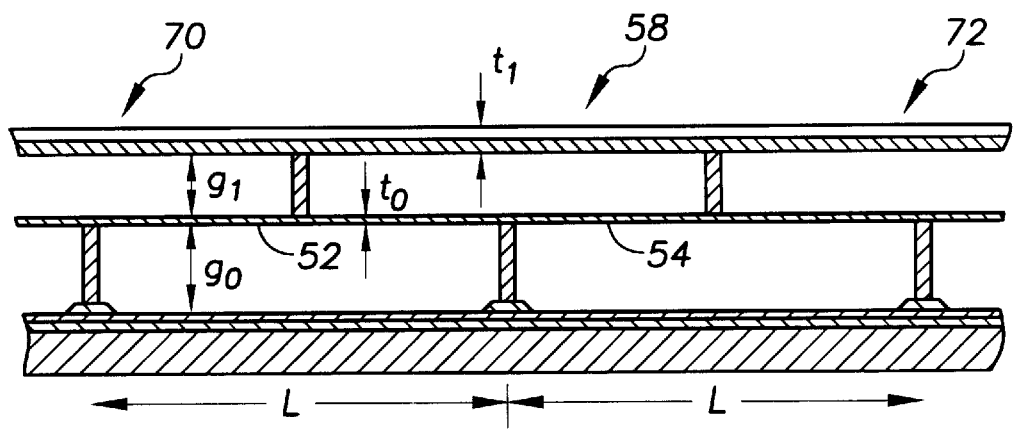
FIGS. 9A–9B are schematic side-view diagrams of a second example configuration of a double beam electrostatic actuation configuration provided by the invention, without and with an applied actuation voltage, respectively.
Figure 9B:
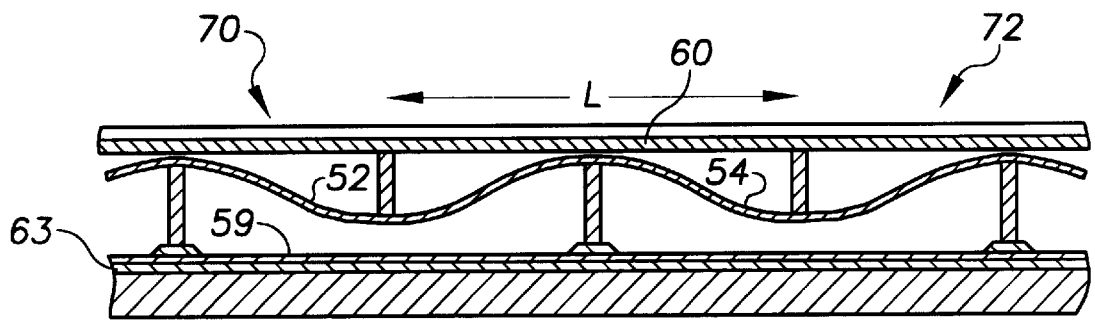

Given these two operational regimes, it can be preferred, in accordance with the invention, to specifically design the structure for the first operational regime, to exploit the planarity it enables. With such a design, for many applications, such as optical applications and others discussed below, it can then be preferred that the auxiliary beam itself functions as a planar surface to be moved. FIGS. 9A–9B provide schematic side-view diagrams of a corresponding example configuration wherein the auxiliary beam 58 is repeated with adjacent beams 70, 72 and so on, to form a row of auxiliary beams all supported atop a corresponding row of actuation beams. With actuating electrode configuration and operation like that of the structure of FIG. 8B, deflection of the row of lower actuation beams results in planar movement of the row of upper auxiliary beams during the first operational regime characteristic of the structure. As discussed below, this arrangement for providing planar motion can be extended to a wide range of electrostatically actuated structures.

Equally importantly, the actuator structures of FIGS. 8A–9B enable the specification of their various geometric features to achieve a desired deflection travel range with a corresponding actuation voltage that is lower than that required for the same travel range for a single beam configuration like that of FIG. 1B. In addition, these actuator structures enable the specification of their various geometric features to ensure that electrostatic pull-in of the structures is mechanically inhibited by the upper auxiliary beam for a corresponding operational actuation voltage range. Each of these capabilities, and corresponding design considerations, will be discussed in turn.

Figure 10A:
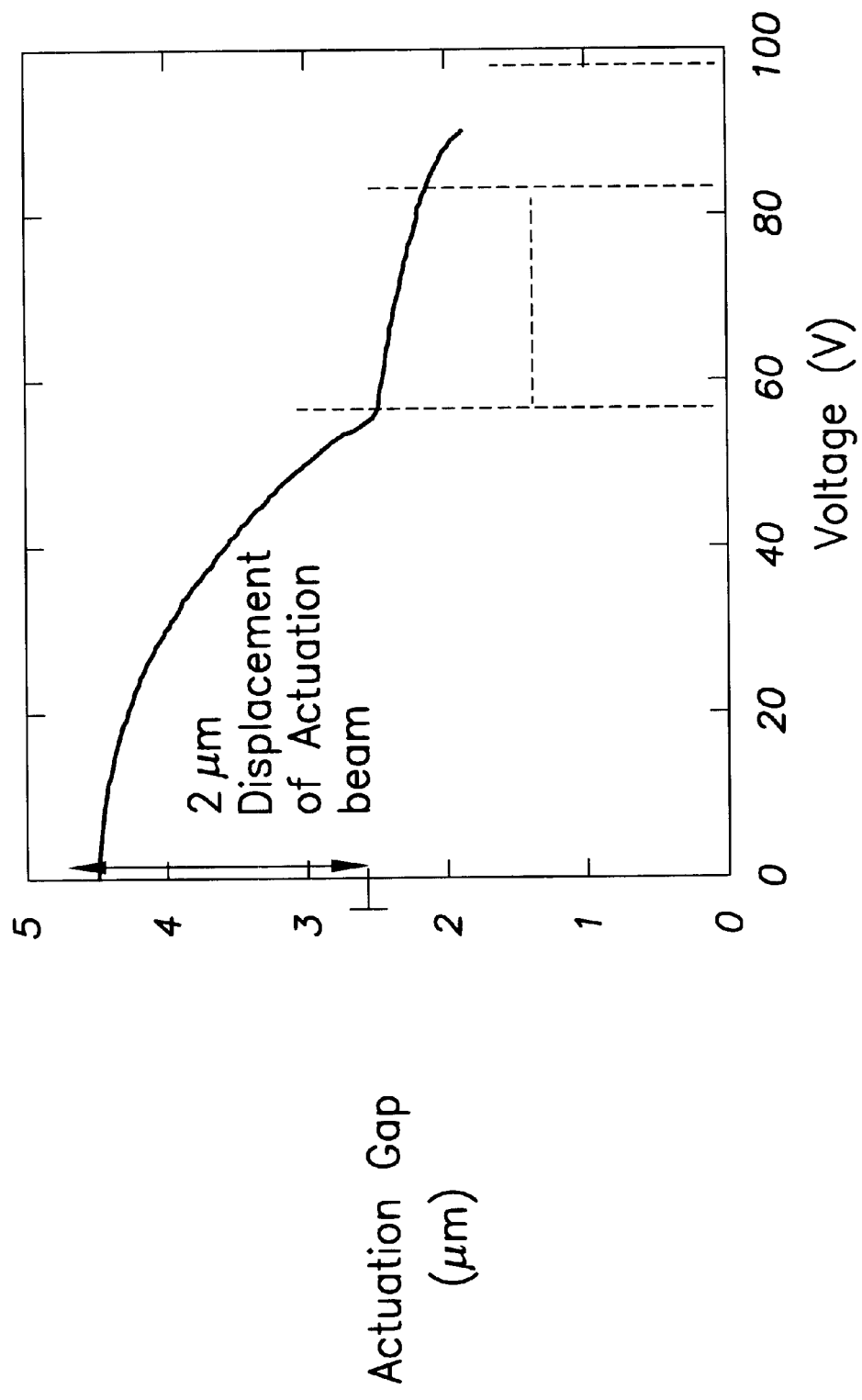
FIG. 10A is a plot of simulation data for actuation gap as a function of applied voltage for the actuation configuration of FIGS. 9A–9B.

Referring to FIG. 10A, there is provided a plot of simulation data for the size of the actuation gap as a function of actuation voltage applied to the actuation beams of the actuator configuration of FIGS. 9A–9B. This plot is based on an initial actuation gap, $g_0$, of 4.5 μm, an actuation beam thickness, $t_0$, of 1 μm, an auxiliary beam thickness, $t_1$, of 4.5 μm, and an auxiliary gap, g1, of 2 μm, for polycrystalline silicon beams and support posts. This geometric specification is selected based on an actuation voltage operational range of 0–80 V.

As shown in the plot, as the actuation voltage is increased from 0 V to about 55 V, the lower, actuation beam deflects about 2 μm; during this time the upper, auxiliary beam passively and with full planarity rides downward on the actuation beam by way of its supports. At about 55 V, the auxiliary beam comes to rest on the actuation beam support due to the displacement of the actuation beam by an amount equal to the auxiliary gap. Then as the actuation voltage is increased, the auxiliary-actuation beam combination deflects in a manner characteristic of the various materials and geometric properties of the combination beam.

Note from the plot that the reduced slope in the region greater than about 55 V indicates that the combination beam does not deflect as readily as the actuation beam alone. This is a result of the increased stiffness of the combination beam relative to the actuation beam alone. The combination beam thereby is found to exhibit a characteristically larger mechanical restoring force, and correspondingly higher effective spring constant, than the actuation beam alone. This larger restoring force in turn increases the voltage required to electrostatically pull-in the combination beam over that required to electrostatically pull-in the actuation beam alone.

The second operational regime thereby is found to provide a controllable margin of safety to ensure that pull-in of the combination beam, i.e., mechanical touch down of the combination beam to the actuation electrodes, does not occur. For the example configuration on which the plot of FIG. 10A is based, electrostatic pull-in is found to occur for an actuation voltage of about 90 V. This is about 10 V over the specified operational range of the actuation voltage for the example stated above. The example configuration thereby provides a 10 V safety margin over the operational voltage range, and ensures that deflection of the combination beam through the entire gap to contact the lower conducting layer is prohibited. For applications where the region of the substrate under the actuation beam is electrically conducting, as in FIGS. 8A–9B, this can be a preferred condition to ensure that shorting of the actuation circuit is precluded. It can also be required for applications where touch down of actuation beams to the substrate must be prevented to avoid in-use stiction, or adhesion, of the beams to the substrate.

Figure 10B:
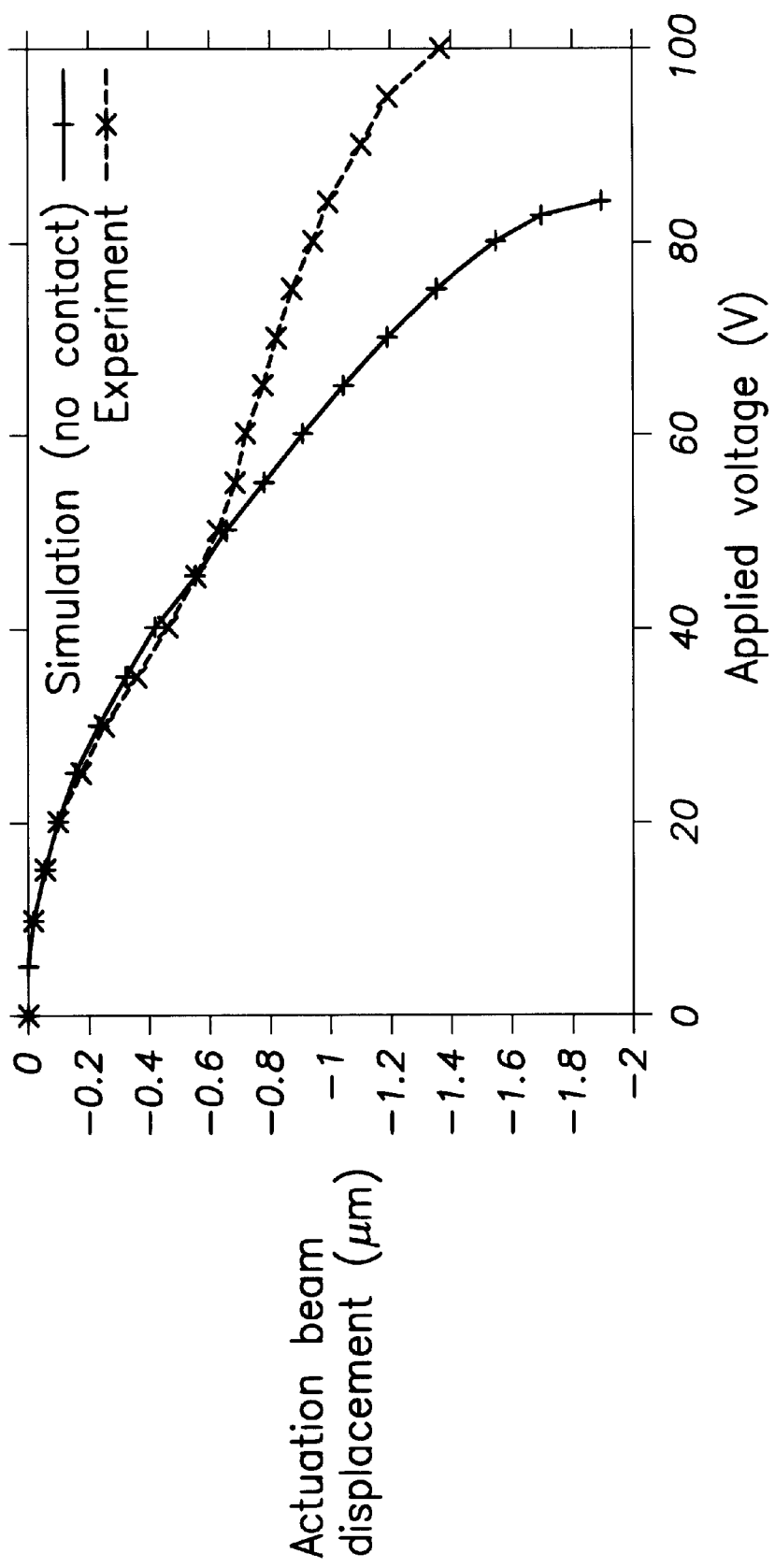
FIG. 10B is a plot of simulation and experimental data for actuation beam deflection as a function of applied voltage, for the double-beam configuration of FIGS. 9A–9B.
Figure 11A:
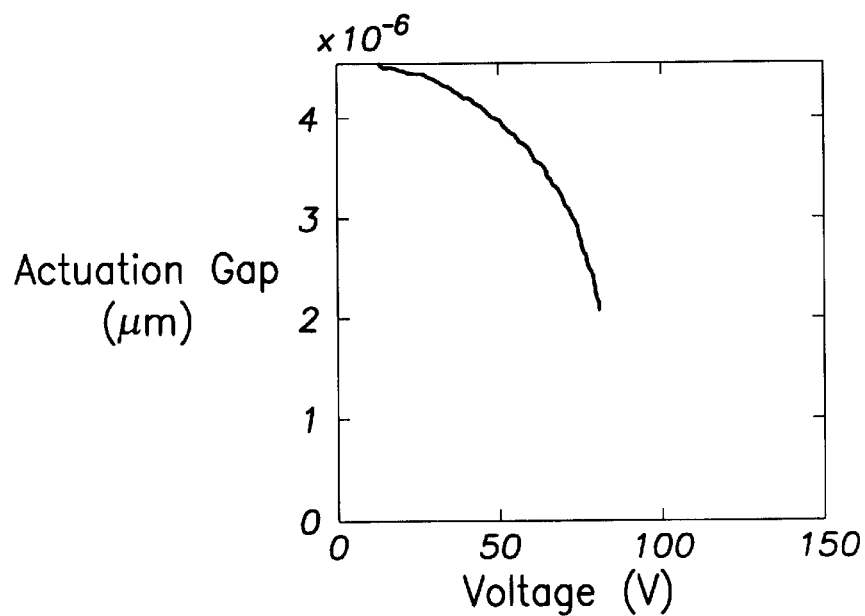
FIGS. 11A–11F are plots of simulation data for actuation gap as a function of applied voltage for the actuation configuration of FIGS. 9A–9B, where the thickness of the auxiliary beam is increased from 2 $\mu$m to 7 $\mu$m in 1 $\mu$m increments.
Figure 11B:
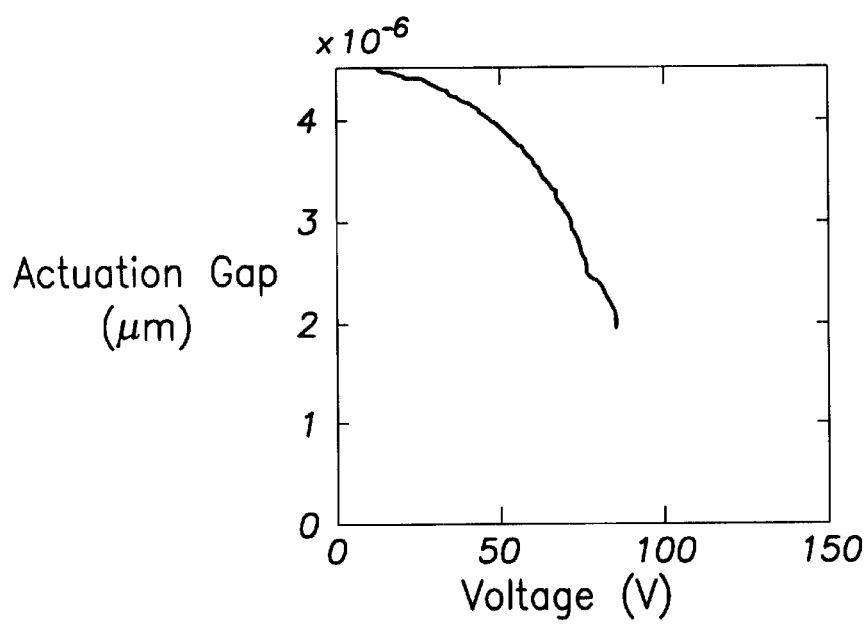
Figure 11C:
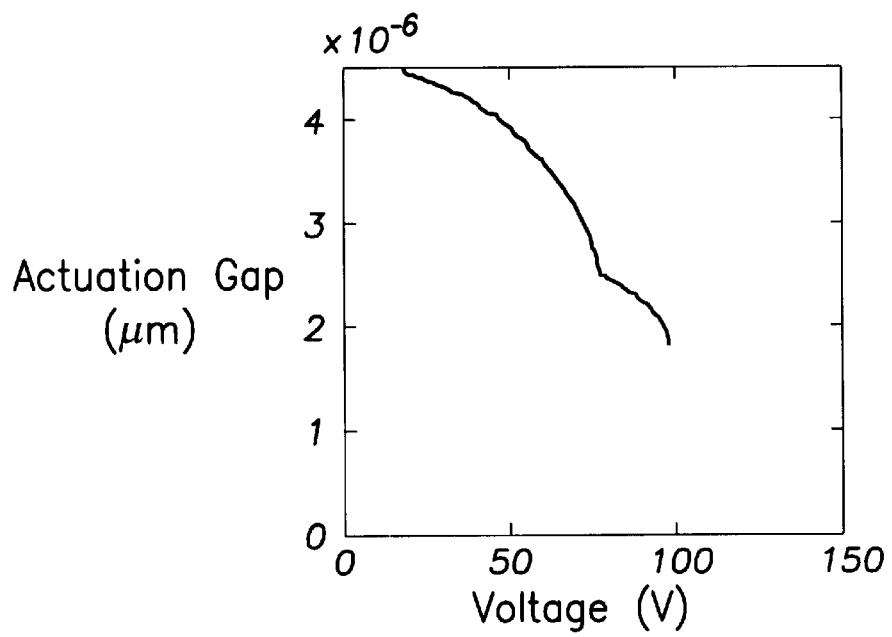
Figure 11D:
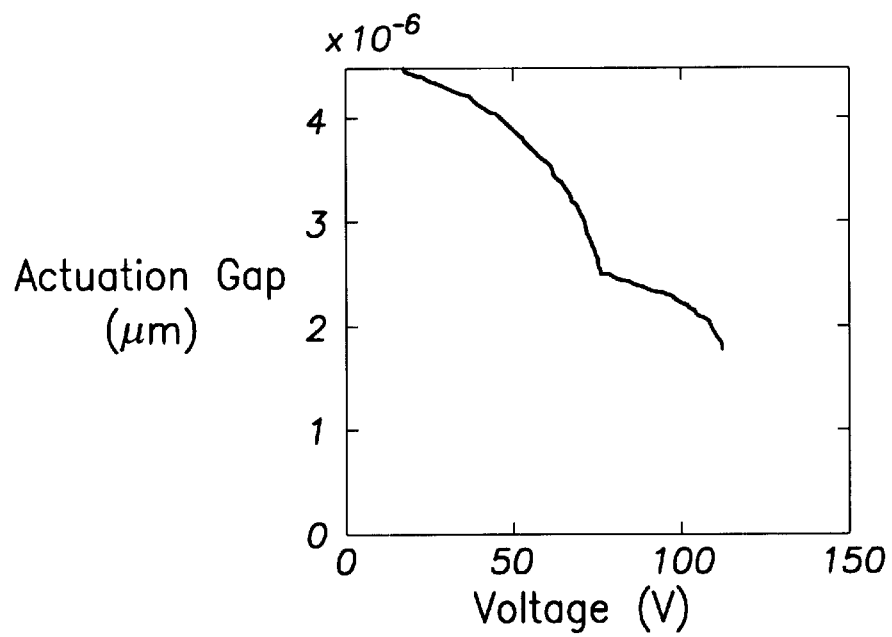
Figure 11E:
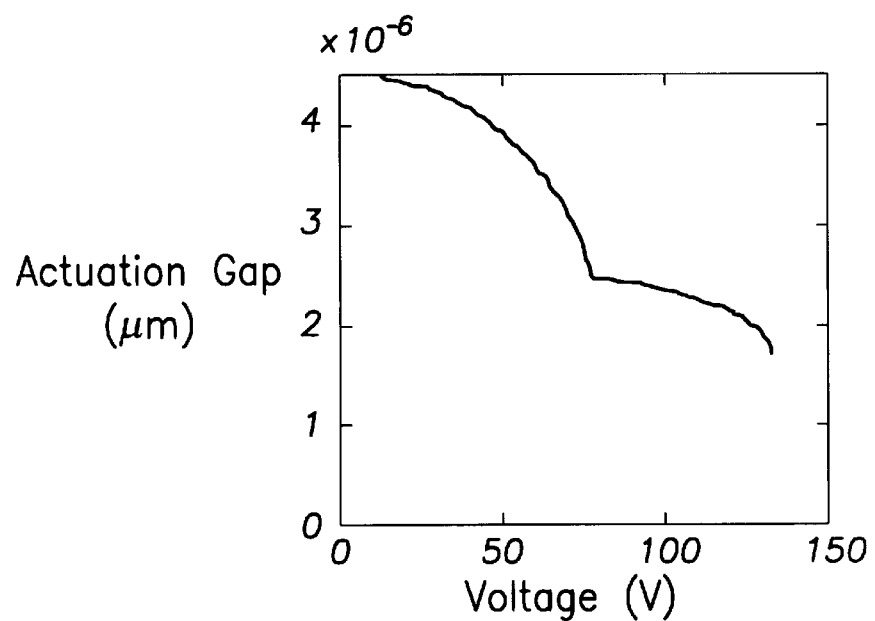
Figure 11F:
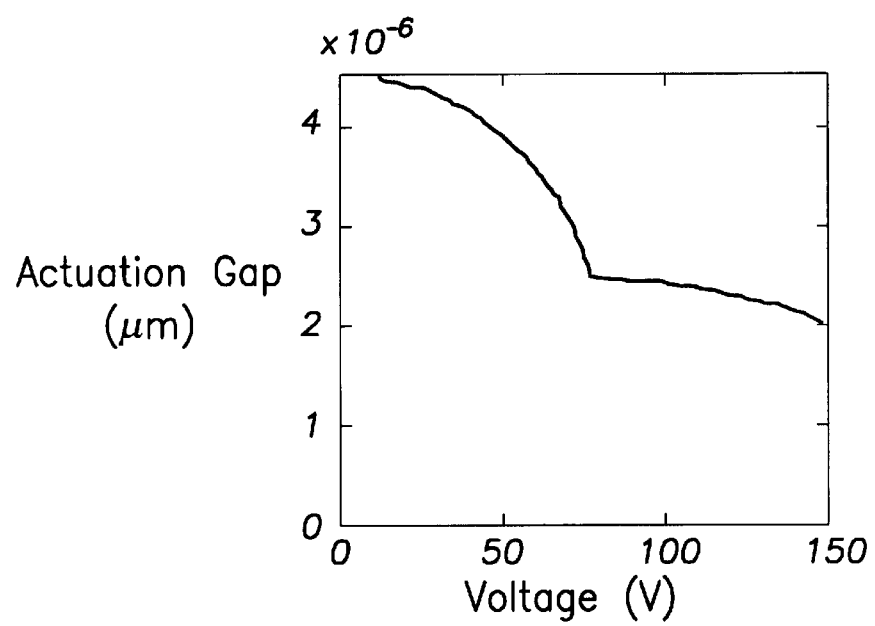
Figure 12A:
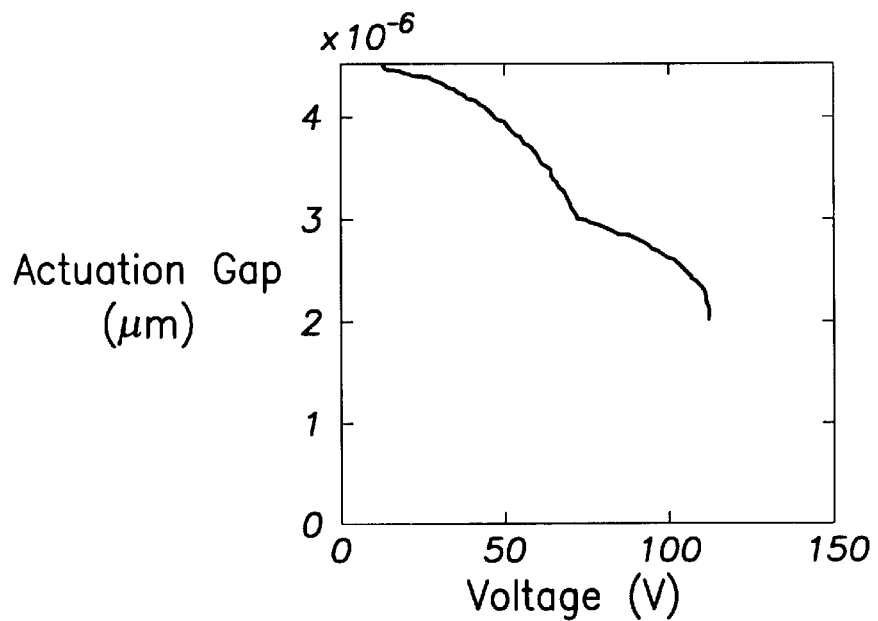
FIGS. 12A–12F are plots of simulation data for actuation gap as a function of applied voltage for the actuation configuration of FIGS. 9A–9B, where the auxiliary gap is increased from 1.5 µm to 2 µm in 0.1 µm increments.
Figure 12B:
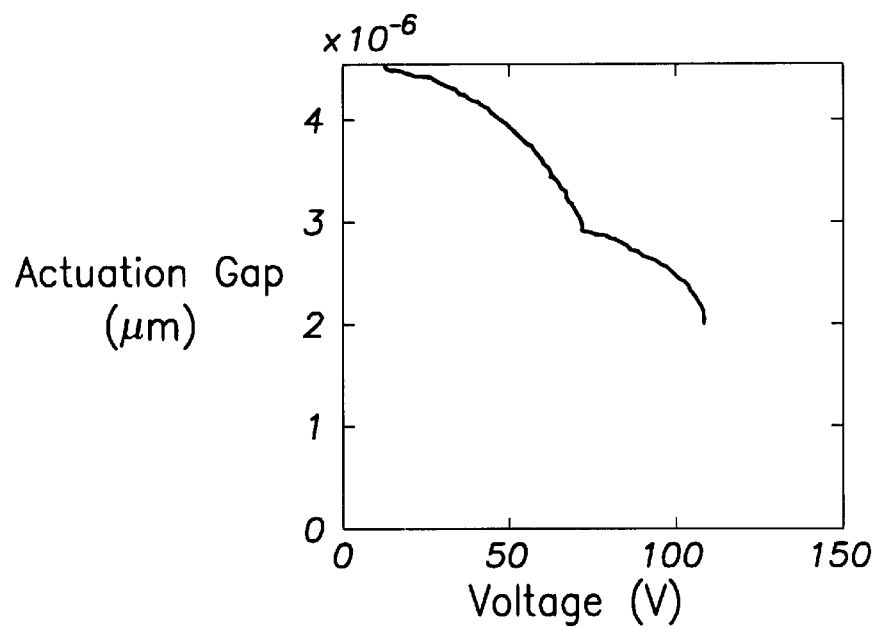
Figure 12C:
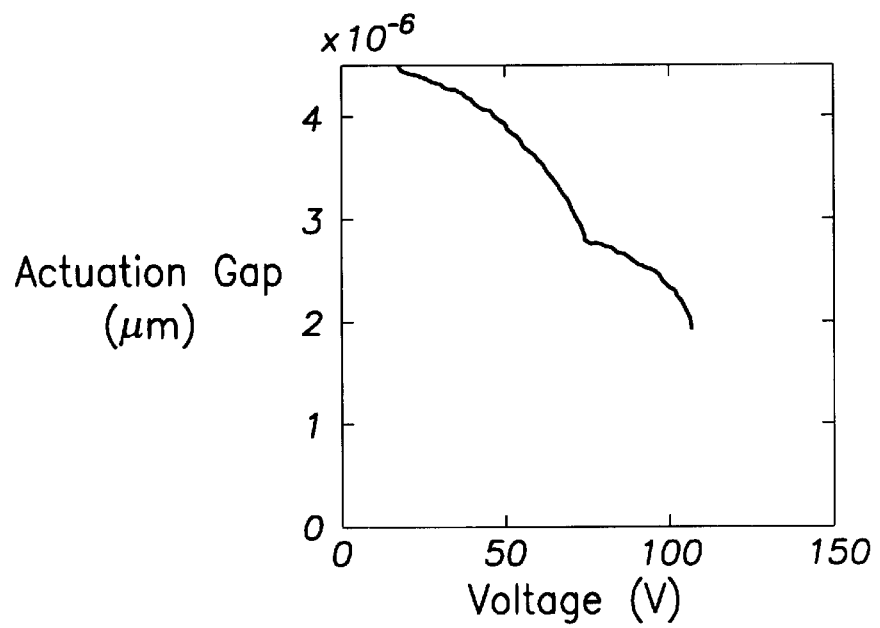
Figure 12D:
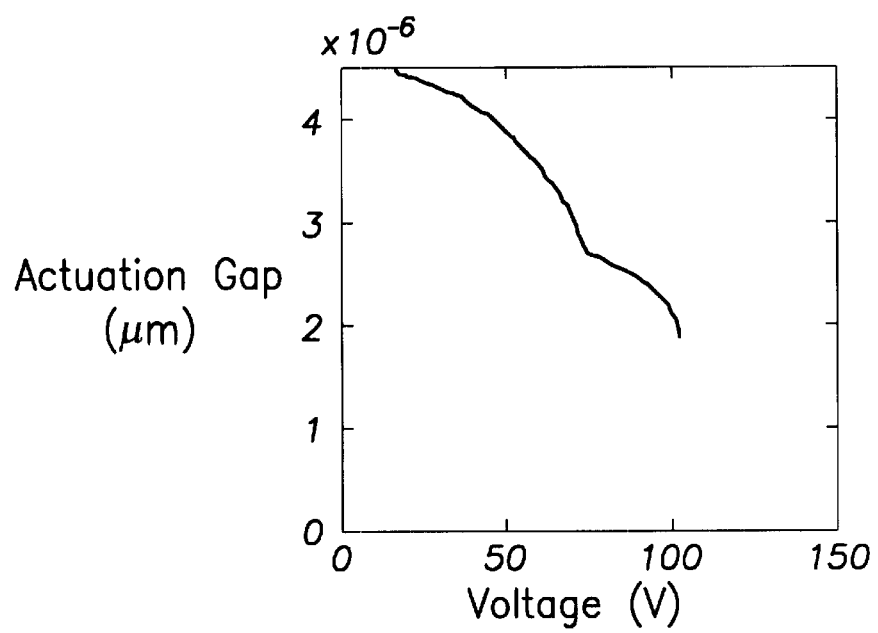
Figure 12E:
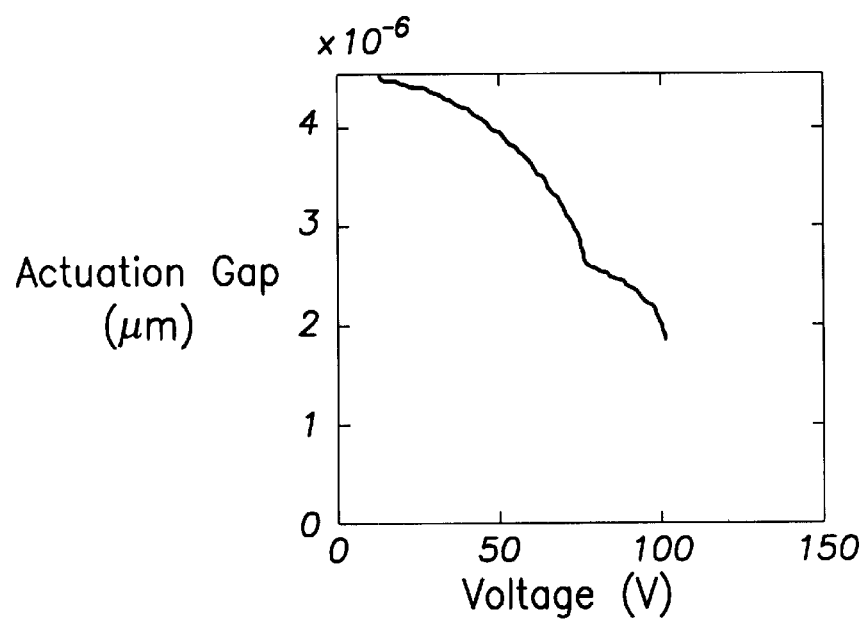
Figure 12F:
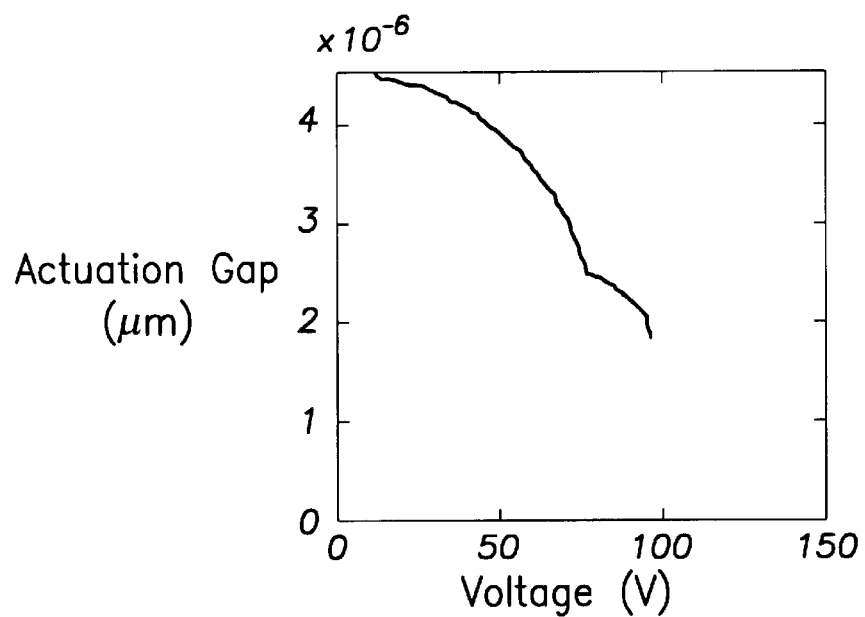
Figure 13A:
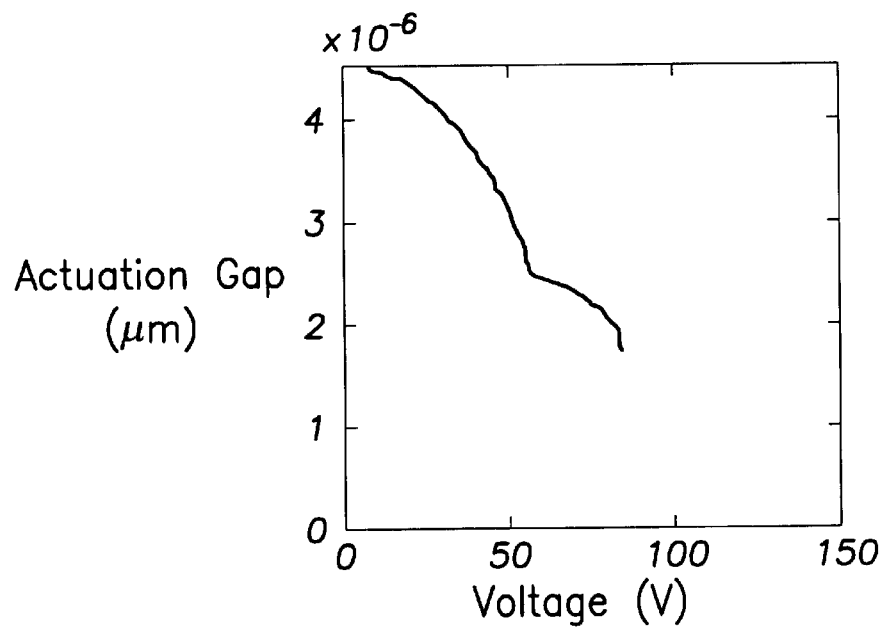
FIGS. 13A–13F are plots of simulation data for actuation gap as a function of applied voltage for the actuation configuration of FIGS. 9A–9B, where the thickness of the actuation beam is increased from 1 µm to 2 µm in 0.2 µm increments.
Figure 13B:
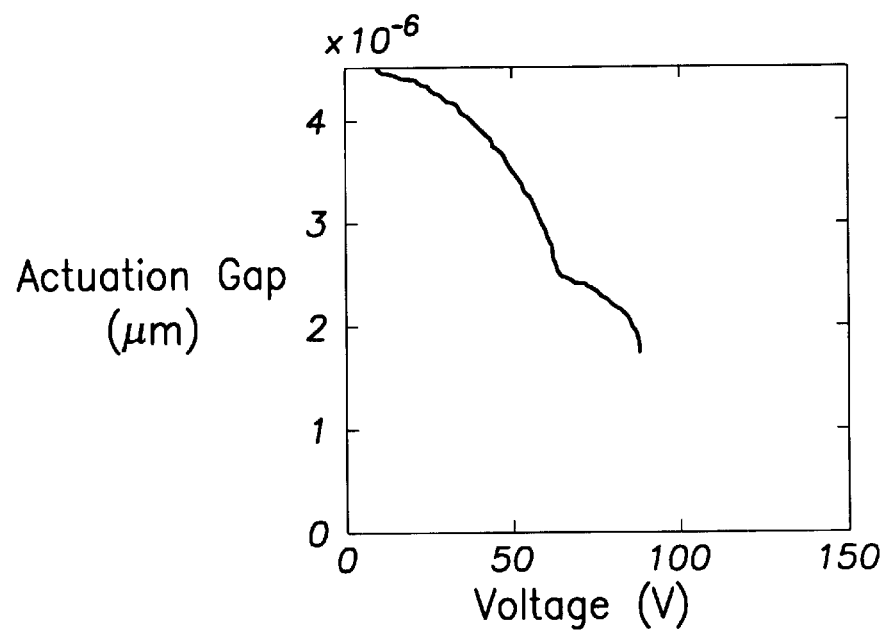
Figure 13C:
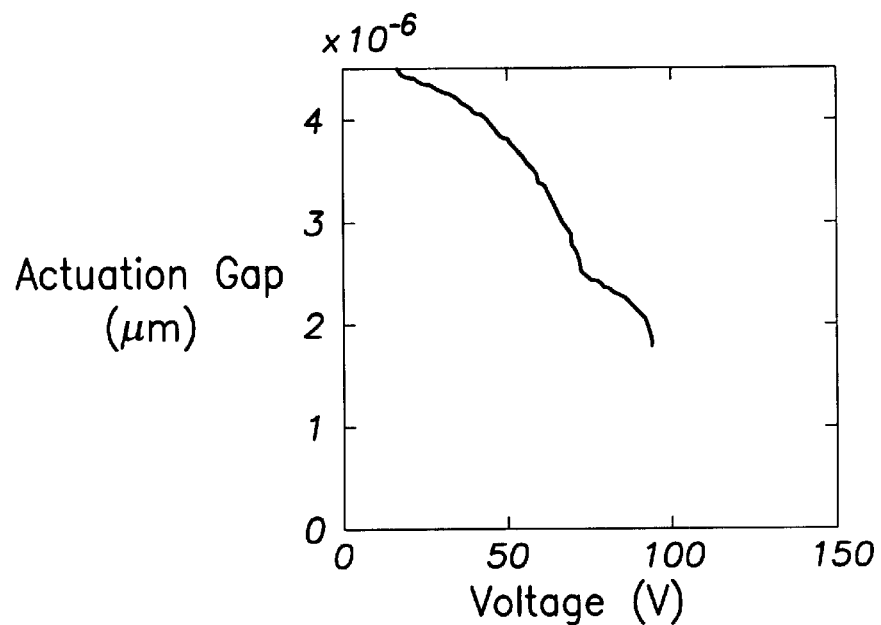
Figure 13D:
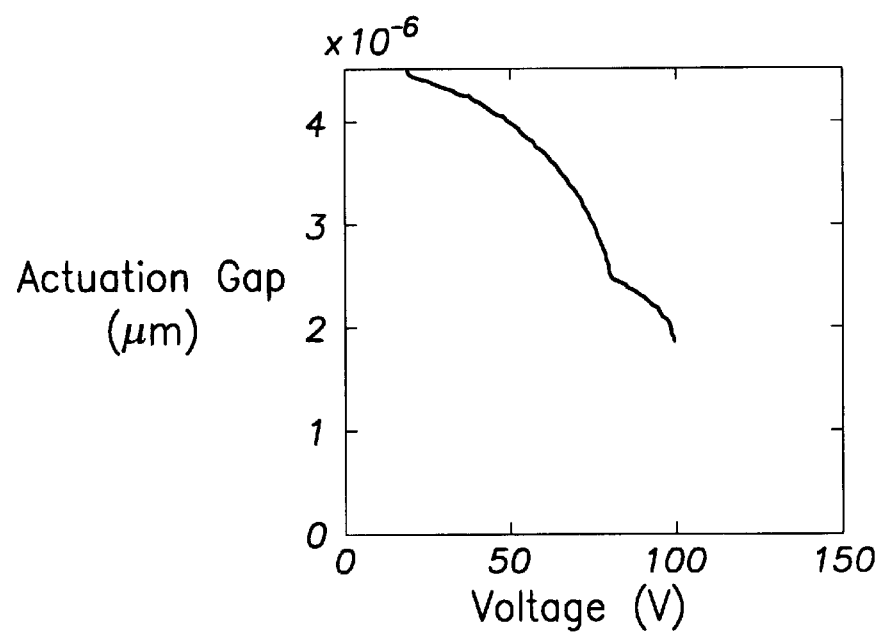
Figure 13E:
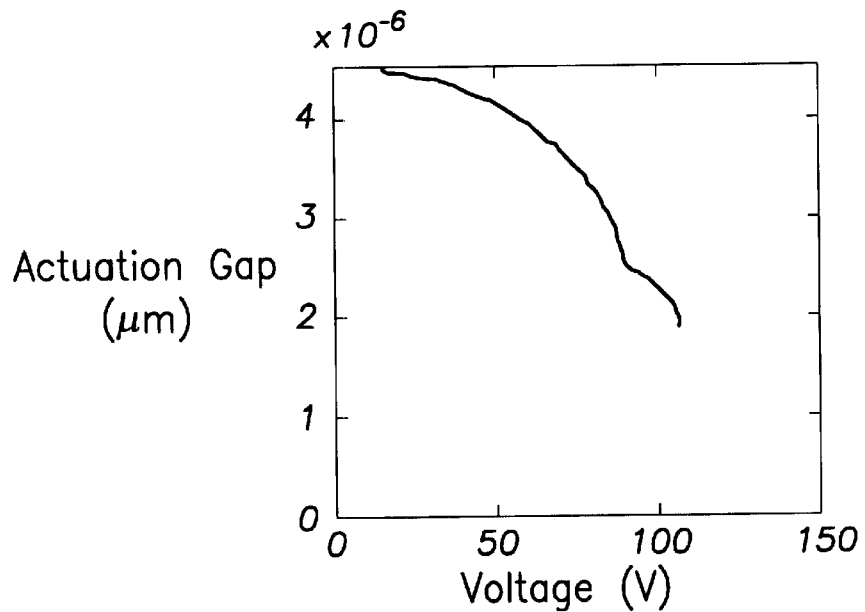
Figure 13F:
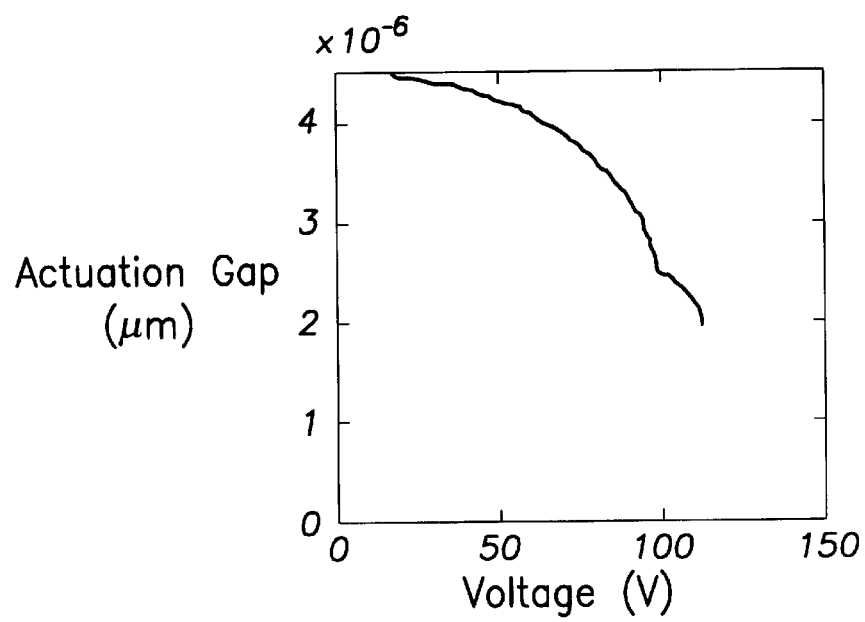

FIG. 10B provides a plot of both simulation and experimental data of actuation beam displacement as a function of voltage to further highlight the two operational regimes provided by the actuation structure of the invention. This data is based on a beam length of 400 μm, a beam width of 12 μm, a 2 μm beam thickness, an actuation gap of 2 μm and an auxiliary gap of 0.75 μm. The simulation data was produced for an actuation beam alone, i.e., with no upper auxiliary beam, while the experimental data was produced for a double beam structure like that of FIG. 9A.

As indicated by the plot, as the voltage is increased from zero to about 55 V, the single beam and multiple-beam structures are displaced equally; this denotes the first operational regime. Than at about 55 V, when the auxiliary beam has been moved downward sufficiently to come to rest on the actuation beam of the multiple beam structure, the simulation and experimental results diverge. Voltages above this level are in the second operational regime. Here the multiple beam displacement is substantially less than the single beam displacement for the same applied voltage, due to the larger mechanical restoring force of the auxiliary-actuation beam combination. The second operational regime of the auxiliary-actuation beam combination is thereby found to enable extension of a stable travel range beyond that provided by a single beam.

In accordance with the invention, the actuation and auxiliary gaps and beam geometries are chosen to produce a selected stable travel range for the first operational regime of the structure, for an actuation voltage range specified for a given application, to enable planarity of the auxiliary beam deflection region as it is moved. The geometries are further chosen to provide a selected pull-in safety margin provided by the second operational regime of the structure. It is also to be noted that while planarity of the auxiliary beam is not maintained in the second operational regime, controllable positioning of the combined beam can be carried out in this regime, as indicated by the data of the plot of FIG. 10B, and can be employed for actuation applications. The invention therefore is not limited to operation of the structure only in the first, stable operational regime, and contemplates design of the structure to exploit the auxiliary and actuation beam bending that is produced in the second operational regime.

The design process of the structure can be carried out by specifying a desired travel range for the first operational regime and then iteratively adjusting the geometric parameters of the structure to achieve an optimum configuration for a selected actuation voltage range. In an example of this process, the deflection of the actuation beam is modeled as a cosine shape, the mechanical forces on the actuation beam as it is actuated is modeled as a distributed pressure load applied to the actuation beam, and the force of the auxiliary beam connection to the actuation beam, when the auxiliary beam comes to rest on the actuation beam, is modeled as a point pressure load based on the support post connection of the auxiliary beam to the actuation beam.

The distributed pressure load, q, on the actuation beam is then given as:

$$q = \frac{\sigma_o \cdot t_0 \cdot \pi^2}{L^2} \cdot z + \frac{E \cdot t_0^3 \cdot \pi^4}{3 \cdot L^2} \cdot z + \frac{E \cdot t_0 \cdot \pi^4}{4 \cdot L^2} \cdot z^3; \quad (10)$$

where $\sigma_0$ is the residual stress in the actuation beam, E is Young's modulus of the actuation beam material, $t_0$ is the thickness of the actuation beam, L is the length of the actuation and auxiliary beams, and z is the downward distance the actuation beam is deflected at its longitudinal center point. The point pressure load, P, of the auxiliary beam on the actuation beam is given as:

$$P = \frac{\sigma_o \cdot t_1 \cdot w \cdot \pi^2}{2 \cdot L} \cdot (z - g_1) + \frac{E \cdot t_1^3 \cdot w \cdot \pi^4}{6 \cdot L^3} \cdot (z - g_1) + \frac{E \cdot t_1 \cdot w \cdot \pi^4}{8 \cdot L^3} \cdot (z - g_1)^3; \quad (11)$$

where $t_1$ is the thickness of the auxiliary beam, w is the thickness of each of the actuation and auxiliary beams, and $g_1$ is the initial auxiliary gap.

The total mechanical restoring force, $F_m$, of the actuator structure is then given as:

$$F_{m1} = q \cdot L \cdot w, \quad z < g_1; \quad (12a)$$

for the first operational regime, before the auxiliary beam comes to rest on the actuation beam, and is given as $$F_{m2} = q \cdot L \cdot w + P, \quad z \geq g_1; \quad (12b)$$

for the second operational regime, after the auxiliary beam is resting on the actuation beam such that a combination auxiliary-actuation beam is formed.

These mechanical restoring forces operate against the electrostatic force, $F_e$, on the actuation beam, which can be estimated as:

$$F_e = \frac{\varepsilon_o \cdot L \cdot w \cdot V^2}{2 \cdot (g_0 - z)^2}; \quad (13)$$

where $\varepsilon_0$ is the permittivity constant and V is the applied actuation voltage.

To determine the deflection of the structure as a function of applied voltage, the mechanical restoring force, $F_m$, is set equal to the electrostatic force, $F_e$, to indicate the applied actuation voltage, V, is a function of deflection, z, as:

$$V = \sqrt{\frac{2 \cdot (g_0 - z)^2}{\varepsilon_o \cdot w \cdot L} \cdot F_{m1}}; \quad z < g_1; \quad (14a)$$

-continued $$V = \sqrt{\frac{2 \cdot (g_0 - z)^2}{\varepsilon_o \cdot w \cdot L} \cdot F_{m2}} \ ; \quad z \geq g_1; \quad (14b)$$

These expressions for the deflection travel produced by an applied actuation voltage can be employed to analyze considerations for the geometric parameters of the structure. For example, the plots of FIGS. 11A–11F present the actuation gap, i.e., the distance between the lowest point of the actuation beam and the lower conducting electrode, as a function of actuation voltage as the thickness of the auxiliary beam is increased from 2 μm to 7 μm in 1 μm increments, for an actuation beam thickness of 1.5 μm, an initial actuation gap of 4.5 μm, and an auxiliary beam thickness of 2 μm. Both beams and all beam supports are specified to be formed of polycrystalline silicon, with a beam width of 10 μm and a beam length of 400 μm. The plots highlight that as the upper, auxiliary beam is made thicker, the stiffness of the combined auxiliary-actuation beam increases, such that the amount of deflection of the combined beam produced for a given actuation voltage decreases as the auxiliary beam thickness is increased. This results in an increase in the actuation voltage that will produce full gap travel of the combined structure, and can provide an increased safety factor.

The plots of FIGS. 12A–12F present the actuation gap as a function of actuation voltage as the initial auxiliary beam gap is increased from 1.5 μm to 2.0 μm in 0.1 μm increments, for an actuation beam thickness of 1.5 μm, an initial actuation gap of 4.5 μm, an auxiliary beam thickness of 4 μm, and length, width, and material parameters as given above. These plots highlight that as the initial auxiliary gap is increased, the stable travel range of the actuation beam before the auxiliary beam come to rest on the actuation beam correspondingly increases. This further validates that the stable travel range of the actuation beam can be specified by the initial auxiliary beam gap.

The plots of FIGS. 13A–13F present actuation gap as a function of actuation voltage as the thickness of the actuating beam is increased from 1 μm to 2.0 μm in 0.2 μm increments, for an initial actuation gap of 4.5 μm, an auxiliary beam thickness of 4 μm, an initial auxiliary gap of 2 m, and length, width, and material parameters as given above. These plots highlight array of cantilever beams 92, 94, 96, 98, each suspended over a substrate 14. The substrate is provided with an insulating layer 100 underlying conducting actuation electrodes 102, 104, 106, 108, that each neighbor a cantilever support post 110, 112, 114, 116. It is to be recognized that the segmented actuation electrodes provided in this example as an implementation of leveraged bending are not required; if leveraged bending is not to be implemented, a continuous actuation electrode can be employed. Auxiliary support posts 118, 120, 122, 124 separate an auxiliary beam 126 from the actuation cantilever beams 92, 94, 96, 98.

As shown in FIG. 17B, when an actuation voltage is applied between the cantilever beams and the actuation electrodes, in the manner of the cantilever arrangement of FIG. 1A, the deflection regions of the cantilevers are deflected downward toward the substrate. This is due to the leveraged bending action applied by the actuation regions on the deflection regions of the cantilevers. Once the deflection region of the cantilevers has moved downward by a distance equal to the initial gap between the upper beam 126 and the cantilevers, the upper beam comes to rest on the cantilevers. Prior to this condition, planarity of the upper beam is maintained as its support posts move downward in unison on the cantilever deflection regions. This cantilever arrangement for the multiple-beam structure of the invention can be configured with continuous, rather than segmented actuation electrodes, if leveraged bending conditions are not desired.

Figure 18B:
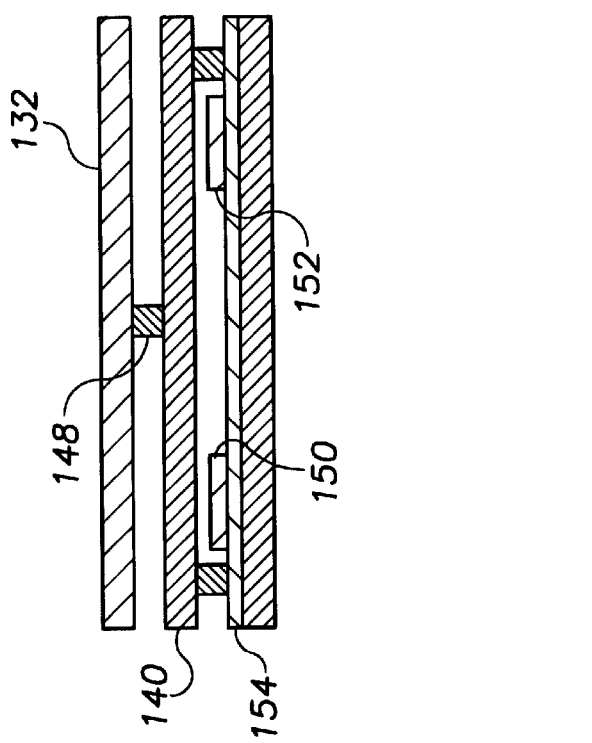
FIGS. 18A–B are schematic top-down and side-view diagrams of a first example electrostatically-actuated plate configuration provided by the invention.
Figure 18A:
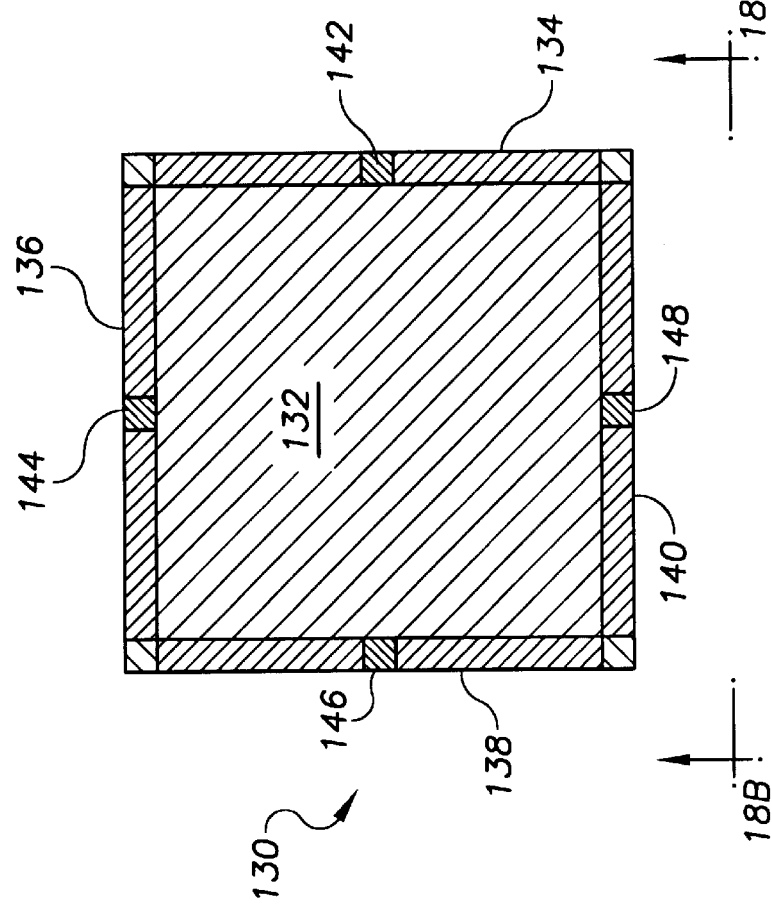

A further multiple-beam actuation structure provided by the invention is shown in the schematic top-down diagram of FIG. 18A and the corresponding side-view diagram of FIG. 18B. Here a discrete actuator 130 is provided, with an upper, auxiliary plate region 132. At the edges of the plate, underlying the plate, are provided actuation beams 134, 136, 138, 140. The plate is connected to the underlying actuation beams by corresponding support posts 142, 144, 146, 148. Actuation electrodes 150, 152 are provided on the substrate, overlaying an that as the actuation beam thickness is increased, the voltage required to produce the same stable travel range increases, and the safety margin provided by the combined beam structure decreases.

These matrix analysis plots are provided as examples of the geometric considerations and design trade-offs that can be made in selecting the geometry of the actuation structures of FIGS. 8A–9B. Further considerations include the desired actuation speed of the structure, the inertia of the structure, which can effect operational speed, the resonant frequency of the structure, and other such operational considerations. An additional consideration is required for the geometry of the support posts of the beams. For some applications, such as optics, it is preferred that the support posts between the actuation beams and upper auxiliary beams be small so as to minimize disturbance of smoothness of any optical layers provided on the auxiliary beam. It is to be recognized, however, that this consideration is to be balanced against a need to maintain mechanical integrity of the support posts.

Figure 14A:
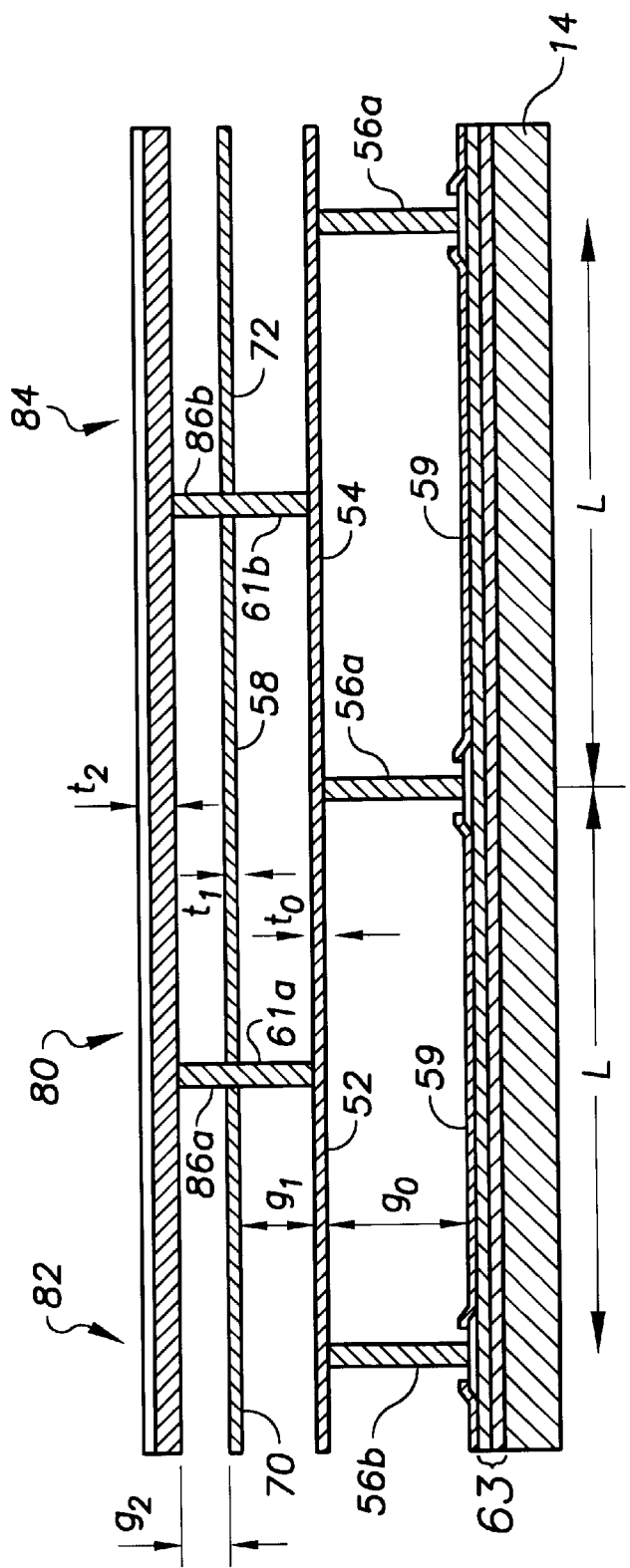
FIGS. 14A–C are schematic side-view diagrams of an example three-beam electrostatic actuation structure provided by the invention, without an applied actuation voltage, with a first actuation voltage applied, and with a second, higher actuation voltage applied, respectively.
Figure 14B:
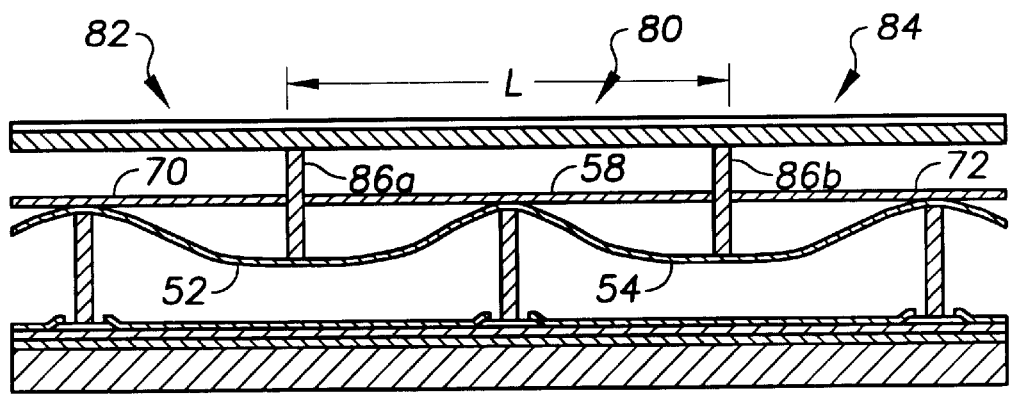
Figure 14C:
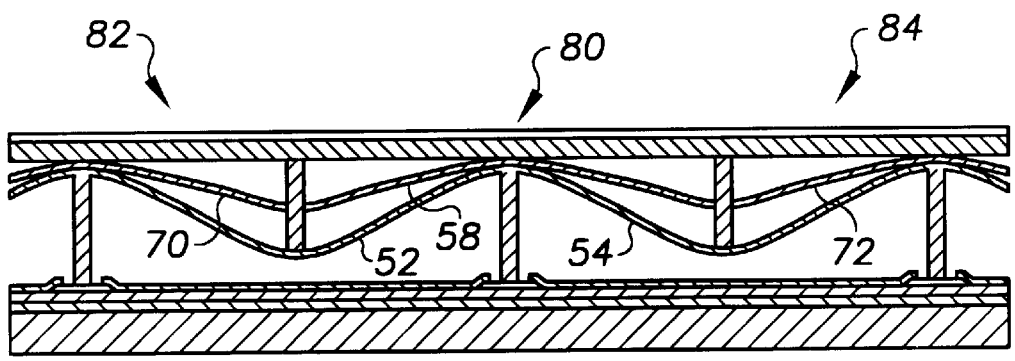

The invention contemplates adaptations of the example structures of FIGS. 8A–9B to include a plurality of auxiliary beams that operate in concert to provide a mechanical margin of safety against electrostatic pull-in of a lower actuation beam. FIGS. 14A–14C present schematic side-view diagrams of operation of such an adaptation. Here, lower actuation beams 52, 54, are supported over a substrate 14 that provides a continuous conducting region 61 under each actuation beam. A first level of auxiliary beams 58, 70, 72 is provided atop the actuation beams, supported by corresponding support posts 61a, 61b. A second level of auxiliary beams 80, 82, 84 is additionally provided atop the first level of auxiliary beams, supported by corresponding support posts 86a, 86b.

This arrangement provides for separate and distinct specification of an initial actuation gap, $g_0$, and two initial auxiliary gaps, $g_1$, $g_2$. The thickness, $t_0$, of the actuation beam, the thickness, $t_1$, of the first auxiliary beam level, and the thickness, $t_2$, of the second auxiliary beam level, similarly can be distinctly specified. This enables a high degree of tuning of the operational parameters of the structure to achieve a desired stable travel range.

As shown in FIG. 14B, the actuation beams can be stably electrostatically deflected downward by a distance equal to the first auxiliary beam gap, $g_1$, before the central, deflection region of the first level of auxiliary beams 58, 70, 72, come to rest on the actuation beams. Then, as shown in FIG. 14C, the actuation beams can be stably deflected a further distance, equal to the second auxiliary beam gap, $g_2$, before the central, deflection region of the second level of auxiliary beams 80, 82, 84 come to rest on the first auxiliary beams. During these two operational regimes, planarity of the deflection region of the second level of auxiliary beams is maintained. Once the deflection region of the second level of auxiliary beams comes to rest on the first level of auxiliary beams, further downward deflection of the actuation beam results in bending of the deflection regions of the first and second levels of auxiliary beams over the corresponding underlying support posts.

The configuration of FIGS. 14A–C is found to introduce a second operational regime in which stable, planar travel of a deflection of a top-most beam level is accomplished. The invention contemplates the extension of this arrangement to any number of auxiliary beam levels that are reasonable for a given application and fabrication process. In general, for a number, n, of auxiliary beam levels, there are a corresponding number, n, of operational regimes through which the actuation beams can be stably deflected and through which planarity of the deflection region of a top-most auxiliary beam level can be maintained. The total stable deflection travel range of the actuation beams through the n stable operational regimes is the sum of the auxiliary beam level gaps, i.e., $g_1+g_2+ \ldots +g_n$.

In designing the multiple-beam structure of FIGS. 14A–14C, the actuation gap is set to accommodate the total stable travel range desired, and the sum of the auxiliary beam level gaps is set at the total stable travel range desired. The thickness of the actuation beams and the first level of auxiliary beams can then be defined based on considerations discussed above. The thicknesses and initial gaps of further auxiliary beam levels are then determined based on modifications of the expressions presented above to take into account the impact of auxiliary beams now resting on the actuating beams. Specifically, the model of the application of a point load to actuation beams must be augmented to include contributions from all sets of auxiliary beams.

Whatever number of auxiliary beams is employed, for many applications, the geometric parameters of the multiple-beam actuation structures of the invention are best specified primarily based on a desired the stable travel range through which planarity of the auxiliary beam or beams is maintained. As explained above, this desired travel range directly sets the initial auxiliary beam gap, and sets the actuation beam gap, based also on the design of the actuation beam, as discussed in more detail below. As can be recognized, there is a certain amount of flexibility, both in the actuation beam design and the design of the auxiliary beam or beams, that can be accommodated to achieve the desired stable travel range. In accordance with the invention, this flexibility can be exploited in the design of the actuation beam geometry to enhance the stable travel range of the structure.

In particular, the leveraged bending actuation technique of the invention can be incorporated into the multiple-beam structure to enhance the stable travel range of the actuation beam and thereby increase the travel range during which planarity of an auxiliary beam or beams is maintained. The considerations described earlier relating to the leveraged bending action provide the ability to in general design the actuation beam to incorporate leveraged bending in this manner.

Figure 15A:
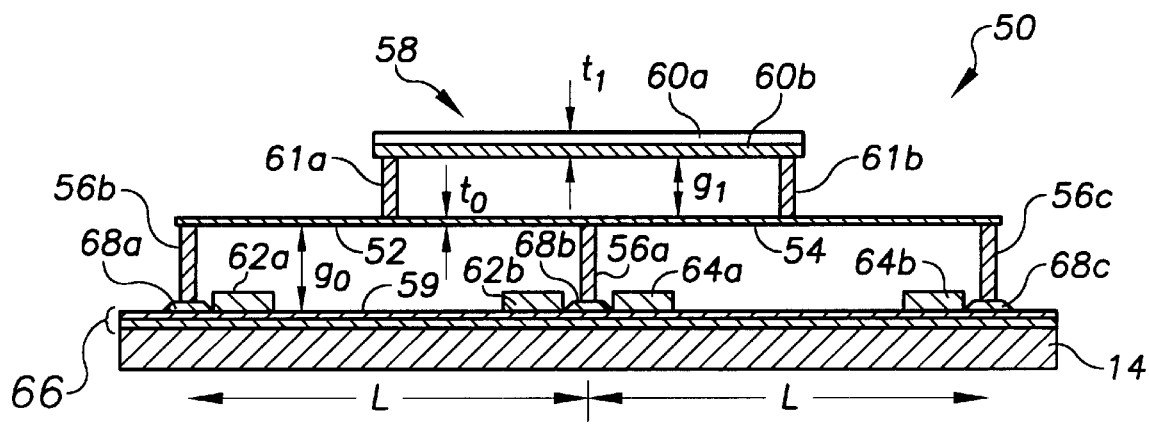
FIGS. 15A–B are schematic side-view diagrams of a the example configuration of a double beam electrostatic actuation configuration provided by the invention in FIGS. 8A–B, here with segmented actuation electrodes for implementing leveraged bending, without and with an applied actuation voltage, respectively.
Figure 15B:
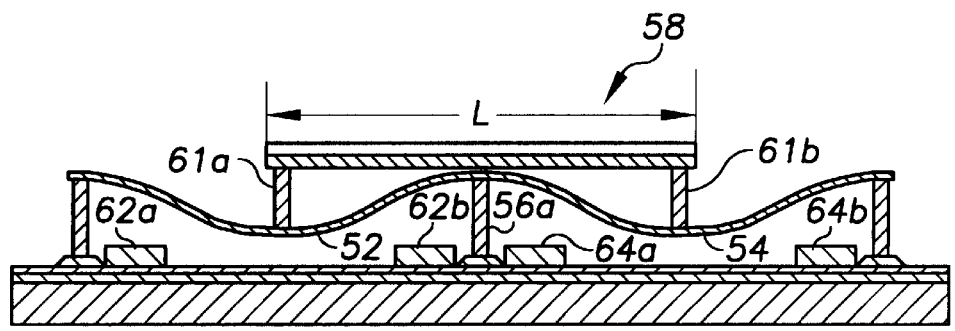

FIGS. 15A–15B provide side-view schematic diagrams of such a double-beam structure incorporating leveraged bending action of the actuation beam. Here, actuating electrodes 62a, 62b, 64a, 64b are provided on the substrate, neighboring the actuation beam support posts 68a, 68b, 68c. An insulating layer or layers 66 are provided on the substrate to electrically isolate the actuating electrodes from the substrate. The extent of the actuating electrodes is selected to define a corresponding actuation region of the actuation beams, in the manner previously described. The separated actuating electrodes thereby replace the continuous conducting layer 61 of the arrangement shown in FIGS. 8A–8B.

Figure 16A:
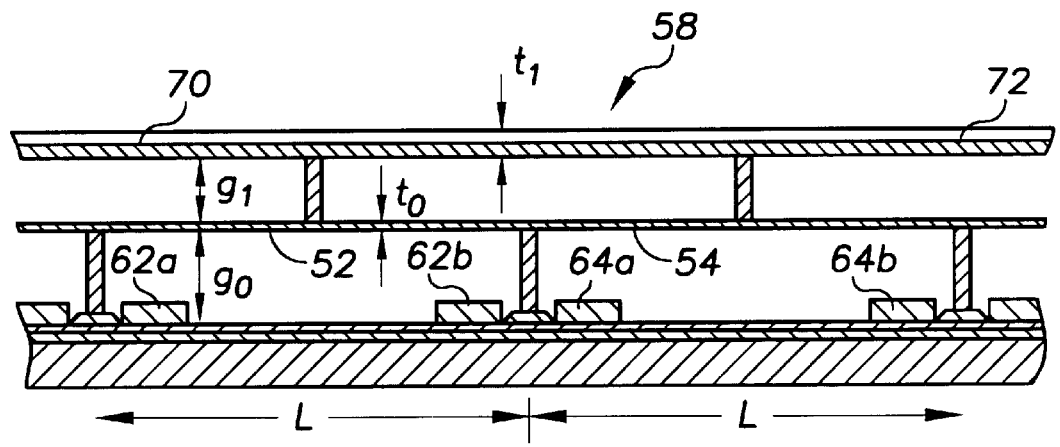
FIGS. 16AB are schematic side-view diagrams of the example configuration of a double beam electrostatic actuation configuration provided by the invention in FIGS. 9A–B, here with segmented actuation electrodes for implementing leveraged bending, without and with an applied actuation voltage, respectively.
Figure 16B:
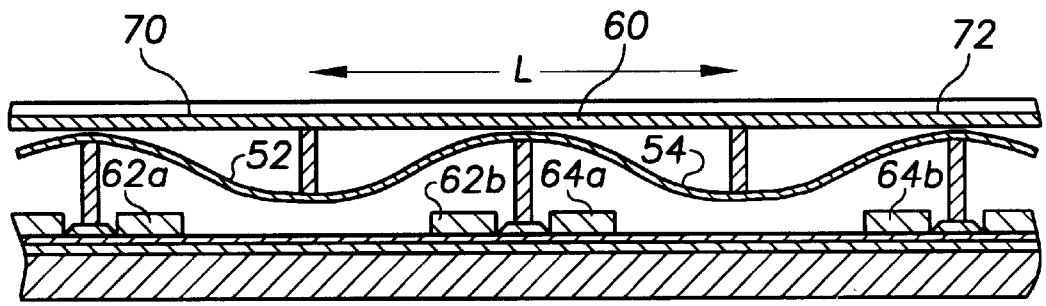

Referring also to FIGS. 16A–16B, the auxiliary and actuation beams can be duplicated in rows to provide, in the manner of FIGS. 9A–9B, linear arrays of actuation beams, here which are deflected under leveraged bending by actuating electrodes 62a, 62b, 64a, 64b. The auxiliary beams here are similarly provided as a linear array of beams to be deflected.

With this configuration, the initial actuation beam gap, $g_0$, and the actuation beam thickness, $t_0$ are selected based on leveraged bending considerations and selected actuating electrode lengths. The auxiliary gap, $g_1$ is set equal to stable actuation beam deflection provided by the leveraged bending action, and based on operational voltage considerations, the auxiliary beam thickness and the length of all of the beams is selected, based on the considerations presented above. With this design, the multiple-beam configuration of the invention enables an actuator that exploits the advantages of the leveraged bending action of the invention while at the same time providing a planar moving surface.

Referring to FIGS. 17A–17B, in a further adaptation of a multiple-beam leveraged bending actuator provided by the invention, there is shown a linear insulating layer 154. As with the example of FIGS. 17A–B. a continuous actuation electrode can alternatively be provided if leveraged bending is not to be implemented.

With this configuration, the discrete plate 132 can be actuated up and down while planarity of the plate is maintained during a stable travel range defined by the gap between the upper plate and the actuation beams. Although this example configuration incorporates leveraged bending of the actuation beams, such is not strictly required; a continuous lower conducting layer can alternatively be employed.

FIGS. 19A–B provide schematic top-down and side-view diagrams of a variation of this structure, here with a discrete plate 160 connected to auxiliary beams 153, 155, 157, 159, peripheral to the plate edge, by corresponding support post extensions 161, 163, 165, 167. Each auxiliary beam is in turn connected to a corresponding lower actuation beam 162, 164, 166, 168, by a support post 170, 172, 174, 176. Actuation electrodes 179, 181 are provided on the substrate below the actuation beams. As with the example of FIGS. 17A–B. a continuous actuation electrode can alternatively be provided if leveraged bending is not to be implemented. With this arrangement, application of a common actuation voltage between each actuation beam and the corresponding actuation electrodes results in planar vertical displacement of the plate; when the actuation beams have been displaced downward by an amount equal to the gap between the auxiliary and actuation beam, the resulting combination beam structure enables additional stable displacement beyond that available to a conventional, single beam configuration. Additionally, the application of differing actuation voltages to the actuation electrodes can be employed for enabling tilt as well as displacement of the plate.

These examples illustrate the wide range of variation of the multiple-beam actuation structure of the invention. For any selected adaptation, the actuation beam of the structure is preferably designed to maximize stable travel range to meet the needs of a given application.

The invention provides a further technique for enhancing the stable travel range of the actuation beam of a multiple-beam electrostatic actuator. In this technique, the actuation beam is designed to maximize a stiffening effect that is inherently caused by strain in the beam related to the elongation, or stretching, of the beam as it is deflected. More specifically, in accordance with the invention, the actuation beam is designed such that as it deflects, the tensile stress in the beam increases due to increasing strain. This increase in stiffness, which is a form of geometric nonlinearity, tends to reduce the positive feedback mechanism that leads to electrostatic pull-in, and thus extends the stable travel range of the actuation beam. In other words, for an actuation beam designed to exploit the strain-stiffening effect, the pull-in voltage and corresponding stable travel range of the beam is increased beyond that for a corresponding conventional beam.

In general, the strain-stiffening effect can be maximized by employing a beam that is thin relative to the extent of the actuation gap. A specific prescription for allowable beam thickness, as well as other geometric factors, can be based on a model of a distributed pressure load applied uniformly to the beam. If it is assumed that the mechanical restoring force of the beam is dominated by bending, then a cosine beam shape can be preferred for the model, whereby the pressure load, q, is given as:

$$q = (\pi^2) \cdot \left(\frac{\sigma_o \cdot t_0}{L^2}\right) \cdot z + \left(\frac{\pi^4}{3}\right) \cdot \left(\frac{E \cdot t_0^3}{L^4}\right) \cdot z + \left(\frac{\pi^4}{4}\right) \cdot \left(\frac{E \cdot t_0}{L^4}\right) \cdot z^3; \quad (15)$$

where $\sigma_0$ is the residual stress of the beam, $t_0$ is the beam thickness, L is the beam length, z is the deflection of the beam through the actuation gap, and E is the Young's modulus for the beam material.

If it is assumed that the mechanical restoring force of the beam is dominated by stress, then alternatively, a parabolic beam shape can be preferred for the model, whereby the pressure load, q, is given as:

$$q = \left(\frac{32}{2}\right) \cdot \left(\frac{\sigma_o \cdot t_0}{L^2}\right) \cdot z + \left(\frac{32}{3}\right) \cdot \left(\frac{E \cdot t_0^3}{L^4}\right) \cdot z + \left(\frac{256}{9}\right) \cdot \left(\frac{E \cdot t_0}{L^4}\right) \cdot z^3. \quad (16)$$

The constants employed in expressions (15) and (16) are exact for the given beam shape assumptions. There is not a large distinction between the results provided by the cosine and parabolic beam shape models; the difference in beam deflection predicted for each of the models varies less than about 5%, depending on the input parameters. The particular model selection is therefore not critical.

The dimensional dependencies of the two models can be highlighted to express the mechanical restoring force, $F_m$, of the beam, per beam width, as:

$$\frac{F_{spring}}{w} = \left[C_1 \cdot \left(\frac{\sigma_o \cdot t_0}{L}\right) + C_2 \cdot \left(\frac{E \cdot t_0^3}{L^3}\right)\right] \cdot z + \left[C_3 \cdot \left(\frac{E \cdot t_0}{L^3}\right)\right] \cdot z^3; \quad (17)$$

where w is the beam width, and $C_1$, $C_2$, and $C_3$ are the numerical constants to be employed from a selected one of expressions (15) and (16).

Expression (17) highlights the components of the mechanical restoring force: the first term indicates the restoring force due to the residual stress in the beam; the second term indicates the restoring force due to bending of the beam, and the third term indicates the restoring force due to stretching, or strain-induced stiffening, of the beam as it is deflected.

The residual stress and bending components of the restoring force are linearly dependent on the beam deflection, z, but the stretching component of the restoring force is dependent on cubic displacement, $z^3$. To maximize the strain-induced stiffening component of the restoring force, it is prescribed that the cubic stiffening component of the restoring force be dominant over the linear terms at maximum beam deflection. Accordingly, at maximum deflection of the beam, it is prescribed that:

$$z > \sqrt{C_4 \cdot \left(\frac{\sigma_o}{E}\right) \cdot L^2 + C_5 \cdot t_0^2} ; \quad (18)$$

where $C_4$ and $C_5$ are constants introduced to combine the earlier constants, $C_1$, $C_2$, and $C_3$.

With expression (18), it is found that strain-induced stiffness of a beam can be maximized to enhance stable travel by selecting the residual stress, Young's modulus, length, and thickness of the beam accordingly. These factors are preferably selected based on a consideration of the ratio of the initial actuation gap to the beam thickness. Specifically, in order to electrostatically deflect the beam in a strain-stiffened mode of operation, the ratio of the actuation gap to the beam thickness is preferably between about two and six. In other words, to maximize the strain-stiffening effect to increase stable travel of the beam, the actuation gap is preferably about twice to about six times the beam thickness. With this constraint, the geometric and materials factors indicated in expression (18) can be selected to optimize performance.

For example, it is found that in general, the Young's modulus of the beam material does not have a significant effect on the strain-induced stiffening, but a larger Young's modulus results in a stable travel range that is a slightly greater percentage of the initial actuation gap. Preferably, the residual stress of the beam is tensile to avoid beam buckling. The level of residual tensile stress of the beam does not have a significant effect on strain-induced stiffening when the beam thickness is close to the initial actuation gap value. As the actuation gap is increased to a few times larger than the beam thickness, then larger stable travel can be achieved with lower tensile stress levels. The residual stress is found to exert a larger effect on the strain-induced stiffening when the actuation gap is between about two and about six times larger than the beam thickness.

The beam length does not have a significant impact on the strain-induced stiffening when the beam thickness is close to the initial actuation gap value. When the actuation gap is between about two and about six times larger than the beam thickness, a larger stable travel range can be obtained by reductions in beam length.

Figure 20:
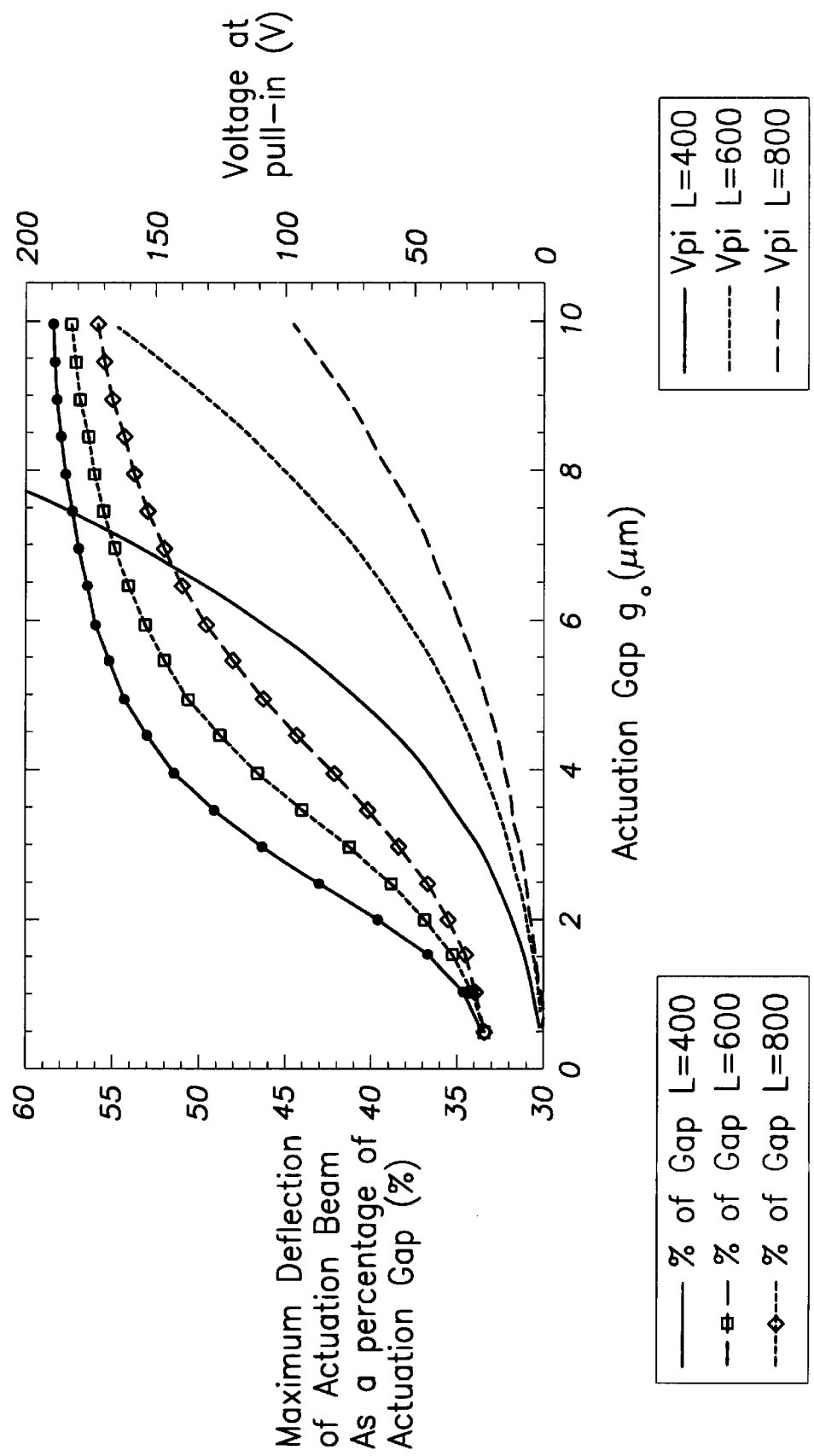
FIG. 20 is a plot of simulation data for maximum actuation beam deflection as a function of actuation gap, and for voltage at pull-in, both as a function of actuation gap, for various beam lengths, for a doubly-supported beam actuation configuration like that of FIG. 1B, but with a continuous, rather than segmented actuation electrode, and designed to implement strain-stiffening of the beam as it is displaced.

The plot of FIG. 20 highlights various of these considerations. The data of FIG. 20 provides, with the left axis, the dependence of the maximum stable deflection of an actuation beam as a percentage of actuation gap as a function of actuation gap, and provides, with the right axis, the dependence of the actuation voltage that produces pull-in as a function of actuation gap, both for three different beam lengths. This data assumes a polycrystalline silicon beam of a thickness of 1 μm.

As shown by the plot, for a given beam length, as the actuation gap is increased, the percentage of gap travel is increased. An actuation gap of about 1 μm is found to enable beam deflection of about 33%, which is the pull-in location characteristic of conventional electrostatically-actuated structures. As the gap is increased above 1 μm, the stable gap travel increases due to the strain-induced stiffening effect. For a given actuation gap, as the beam length is decreased, the stable gap travel is correspondingly increased. For any beam length, the ability to increase the stable travel range saturates at about 60% of the gap.

Also as indicated by the plot, for a given beam length, the pull-in voltage of the beam increases as the actuation gap is increased. But for a given actuation gap, as the beam length is increased, the pull-in voltage decreases. Based on these and the above considerations for beam deflection as a percentage of actuation gap, it is found that for larger actuation gaps, the stable travel range of the beam can be correspondingly increased, and a larger actuation voltage is required for the increased travel. From the expressions given above, it is further found that a reduction in beam thickness enables an increase in stable travel, and a reduced actuation voltage is required for the increased travel. Accordingly, increases in actuation gap and reductions in beam thickness enable an increase in stable travel while not requiring a significant increase in actuation voltage to achieve the stable travel.

With these considerations, in accordance with the invention, the design of an electrostatically-actuated beam that exploits strain-induced stiffening to maximize stable travel is carried out by first selecting a desired stable travel range and then setting the initial actuation gap accordingly. A conservative estimate of stable travel through about 50% of actuation gap can be preferred for many applications. The beam material, residual stress, and thickness are then selected based on expression (18) above. A beam length is then selected, based, e.g., on the plot of FIG. 20, to enable actuation of the desired stable travel range with a selected actuation voltage range.

It is to be recognized that a relatively flexible beam may be required to enable a desired actuation voltage range, and for some configurations, the structure may then be subject to unintended pull-in, contact, or stiction with the substrate during fabrication and/or operation. It is therefore preferred that the structure geometry resulting from a given design scenario be evaluated for fabrication and operational considerations to ensure that a sufficiently robust actuation structure results. The spring stiffening effect provides some degree of robustness against unintended contact, and adds merit to this design.

The invention contemplates electrostatically actuated structures that incorporate both leveraged bending action and strain-induced stiffening conditions to maximize the stable travel range of the actuator. For example, the actuation structures shown in FIGS. 1, 6, 8, 9, 14, 15, 16, 17, 18, and 19, including the single as well as multiple-beam structures, can all be adapted to incorporate both leveraged bending action and strain-induced stiffening conditions. Specifically, it is possible to implement a combination of leveraged bending and strain-induced stiffening conditions over the particular range of actuation beam thicknesses that accommodate both conditions. A wide range of applications are addressed by the electrostatic actuation structures provided by the invention. An actuator arrangement in which a lower actuation element is stably actuated to move an upper element while maintaining planarity of the upper element can be particularly well-suited for optical applications; commonly, optical applications require a planar, reflective surface whose position can be controlled in an analog fashion. One such optical application that is addressed by the invention is a programmable, optical diffraction grating 180, shown schematically in a cross-sectional view in FIG. 21.

As shown in the figure, the diffraction grating 180 includes an array 182 of a number, n, of flat mirrors 184a–184n, that are suspended over a substrate 186. In this example embodiment, the mirrors are electrically conducting and their upper surface is provided with an optically reflecting coating. An actuating electrode array 188 is provided on the substrate, with one electrode or a specified set of electrodes designated for a corresponding suspended mirror. The actuating electrodes are electrically isolated from the substrate by an insulating layer or layers 190 and each can be individually addressed. This enables application of a distinct actuation voltage between each mirror and corresponding actuating electrode, in the manner described previously. With this arrangement, the height of each mirror can be individually electrostatically controlled to enable distinct analog positioning of each of the mirrors.

When light 192 from a broadband source is directed onto the array of mirrors, the heights of the mirrors control the optical path length of light reflected from the mirrors. Specifically, path of a light ray reflected from the grating depends on the height of that mirror from which the ray was reflected. This effect results in a phase shift between reflected light rays, and leads to the formation of a diffracted light beam 194. Collection of this diffracted light beam 194 at an angle, $\theta$, corresponding to the selected mirror heights, enables detection and analysis of wavelength-specific optical information. Thus, the diffraction grating 180 functions as an electrically-programmable optical filter, where the heights of the mirrors implement an optical diffraction transfer function. Accordingly, real time electrostatic analog positioning of the grating mirror heights enables adjustment and modulation of the optical transfer function of the grating.

These capabilities of the diffraction grating of the invention are particularly well-suited for use in an electrostatically programmable polychroniator system as contemplated by the invention. In general, in a polychromator system, for an array of diffraction grating mirrors of a given periodicity and of given mirror heights, a polychromatic light beam, or a plurality of light beams of differing wavelengths, can be dispersed over a range of wavelength-dependent diffraction angles by directing the polychromatic input light at the diffraction grating. This enables wavelength-specific demultiplexing of the dispersed reflected light for spectral analysis or other application. Similarly, the diffraction grating can be operated to enable multiplexing of input dispersed light to form polychromatic output light by appropriate selection of the mirror heights and periodicity.

Electronic programmability of a diffraction grating for a polychromator system provides the ability to reconfigure the grating such that wavelength-specific optical analysis, such as optical correlation analysis, can be adjusted in real time, as an environment to be analyzed changes. This is particularly important for, e.g., spectral analysis applications for the identification of multiple target chemicals. The ability to address multiple target chemicals with a single polychromator system eliminates the need for redundant systems and enables high-speed real time analysis. Mirror positions for target chemicals of interest can be computed and memorized prior to system operation. The electrostatically programmable diffraction grating of the invention thereby enhances the efficiency, the effectiveness, and the adaptability of a polychromator system incorporating the grating.

Specific design and operational considerations for a polychromator system employing an electrostatically-programmable diffraction grating are presented in U.S. Pat. No. 5,757,536, issued May 26, 1998, to Ricco et al., entitled "Electrically-Programmable Diffraction Grating," the entirety of which is hereby incorporated by reference.

Figure 22:
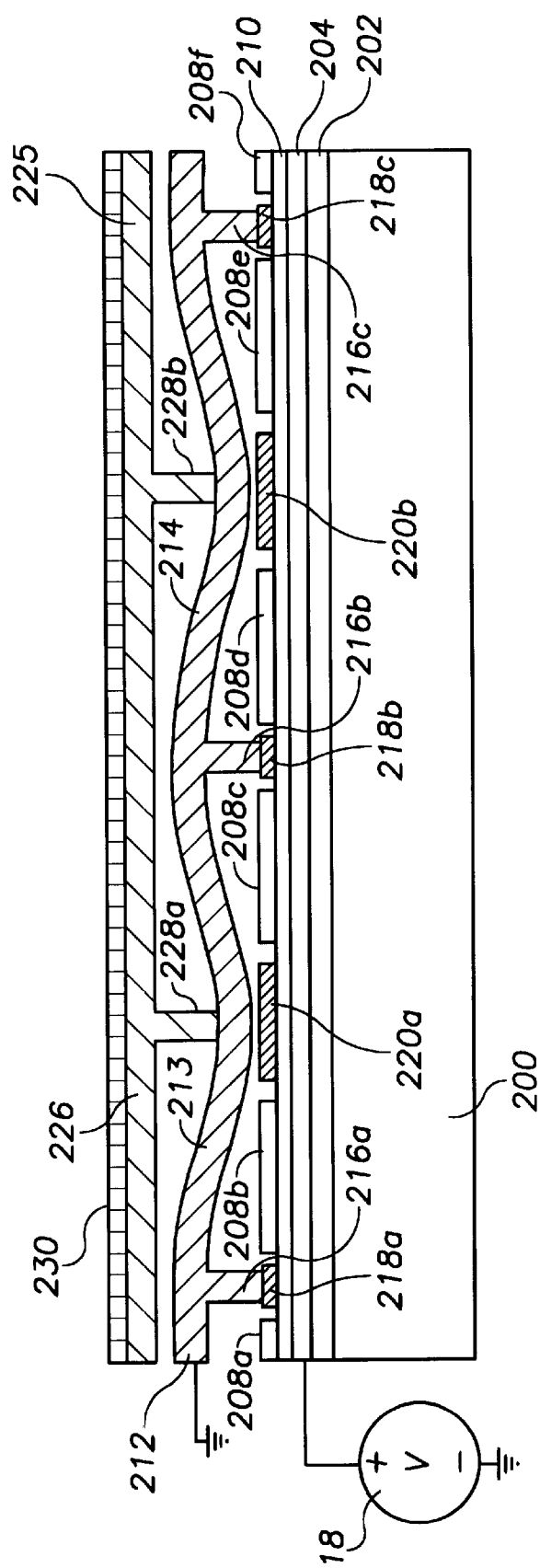
FIG. 22 is a schematic side-view diagram of a portion of one row of grating elements in the diffraction grating of FIG. 21.

FIG. 22 presents a schematic side view of an electrostatically programmable diffraction grating element that is integral to a diffraction grating provided by the invention for the Ricco polychromator system. This example element and grating array are particular to a polycrystalline silicon (polysilicon), surface micromachining fabrication process, but as explained below, such is not required in general by the invention. As shown in the figure, a silicon substrate 200 provides a platform for the array. An insulating layer 202, e.g., a layer of silicon nitride, is provided on the substrate surface to electrically isolate the substrate from the actuating electrodes. A first conducting layer 204, e.g., a layer of polysilicon, is provided connected to an actuation voltage source 18 for delivering actuation voltage to the actuating electrodes.

As shown in the figure, the actuating electrodes 208a, 208b, 208c, 208d, 208e, 208f are provided in this example as segmented electrodes, to enable implementation of the leveraged bending actuation scenario provided by the invention. Each electrode is connected to the underlying conducting layer 204 through a via in an insulating layer 210, e.g., a layer of silicon nitride. A row 212 of actuation beams, two of which, 213, 214, are fully shown, are supported by support posts 216a, 216b, 216c. Both the actuation beams and the support posts are in this example conducting polycrystalline silicon. An electrical ground pad 218a, 218b, 218c is provided at the base of each support post to enable setting the electrical potential of the actuation beams at ground. In addition, grounded landing electrodes 220a, 220b are provided under the deflection region of each actuation beam to ensure that no shorting of the actuation circuit could occur should an actuation beam touch down to the substrate during operation.

A row 225 of mirror beams, one of which, 226, is fully shown, is supported over the row of actuation beams by support posts 228a, 228b. In this example, the mirror beam row and its support posts are conducting polycrystalline silicon. It is contemplated in accordance with the invention that the post design be application-specific in that the mechanical integrity of the post must meet the requirements of a given application. A reflective mirror surface 230 is provided on the top of the mirror beams; in one example, layers of chrome and gold can be employed to form this mirror surface.

Figure 21:
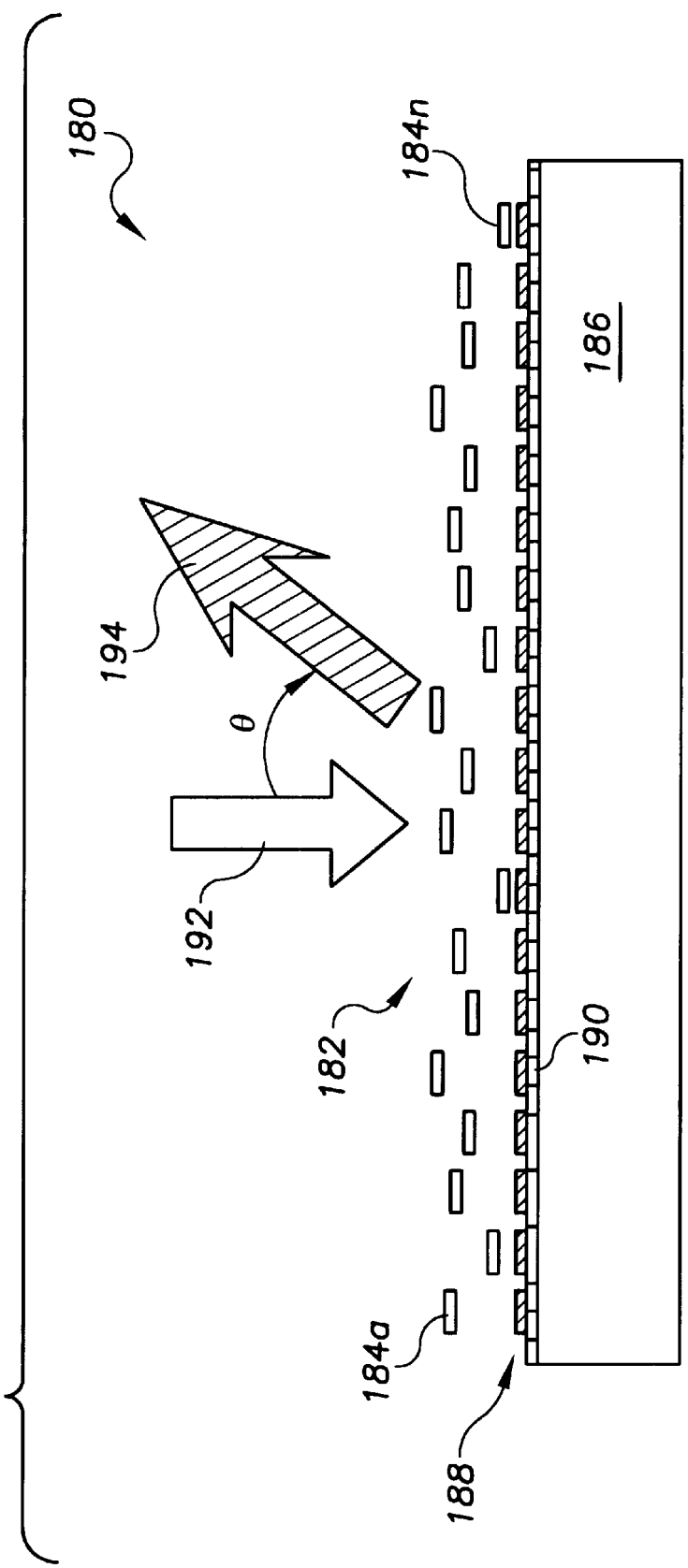
FIG. 21 is a schematic side-view diagram of an electrically-programmable diffraction grating provided by the invention.

Referring also back to FIG. 21, this configuration provides an arrangement wherein each mirror beam row 230, FIG. 22, corresponds to one of the electrostatically programmable mirrors in the mirror array 182, FIG. 21. Thus, separate control of each mirror beam row enables a desired height arrangement across the mirror array to produce a selected diffraction grating optical transfer function. Adjustment of the height of one or more mirror beam rows thus adjusts the optical transfer function of the grating in real time. This further enables real time transfer function modulation as required for a given application. It is thus preferred in accordance with the invention that the design of the mirror beam and actuation beam rows enables a stable mirror travel distance that is at least as large as the mirror height adjustment anticipated for a given application.

The double-beam structure of the grating of FIG. 22 enables adjustment of the height of each mirror beam row while maintaining planarity of the mirrors. Further, as explained previously, when the mirror beam row comes to rest on the lower actuation beam row, the combined-beam structure is characterized by an effective stiffening action that provides a margin of safety against pull-in of the structure. For appropriate design choices, as explained above, the mirror beam row effectively acts as a mechanical stop to inhibit pull in of the structure.

Incorporation of the leveraged bending action of the invention into the structure can be employed in the manner previously explained to enhance the stable travel range of the actuation beams and correspondingly, the planar travel range of the mirror beams. The actuation beam geometries can further be specified in the manner previously described to produce a strain-induced stiffening effect. It is to be recognized that if leveraged bending actuation is not desired, a continuous, rather than segmented, actuation electrode configuration can be employed in the manner described above. Strain-induced stiffening of the actuation beam is still accommodated by this arrangement.

In accordance with the invention, the example grating structure of FIG. 22 can be adapted to accommodate a range of applications. For example, if a stand-alone grating element is to be employed rather than the element rows of the figure, then the underlying conductor layer 204 and via connections to segmented electrodes need not be incorporated. Instead, segmented electrodes, or a continuous electrode, can be provided beneath the structure as in designs previously discussed. The conductor layer 204 and electrical via connections are primarily required only for those configurations where connection to the actuation electrodes is complicated by proximity of multiple beams.

Figure 23A:
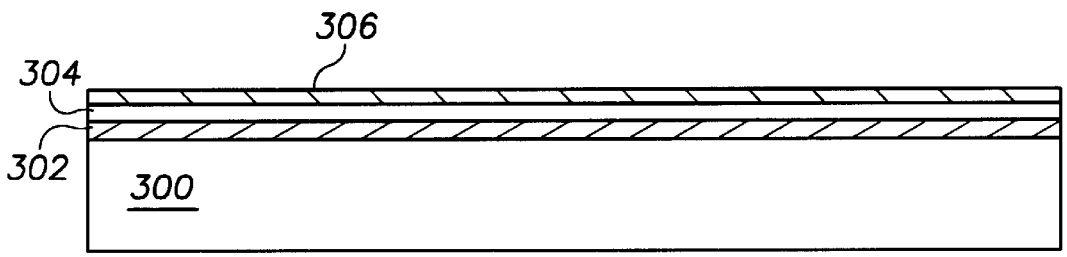
FIGS. 23A–23K are cross-sectional diagrams of an example sequence of fabrication steps provided by the invention for producing the diffraction grating of FIG. 21.

FIGS. 23A–23K provide cross-sectional views of an example fabrication sequence provided by the invention for producing the diffraction grating structure of FIG. 22. Referring to FIG. 23A, in the example process, a starting material of, e.g., a 4-in p-type double-sided polished silicon wafer 300 is provided. It is preferable that the wafer thickness vary over a die area by much less than the optical wavelengths of interest. A layer 302 of silicon dioxide, e.g., of about 6000 Å in thickness, is thermally grown on the substrate, and a layer 304 of silicon nitride of, e.g., about 3000 Å is formed by low pressure chemical vapor deposition (LPCVD). These layers together form the electrical isolation of the substrate. The oxide layer, which is compressive, is employed to balance the tensile residual stress of the nitride layer.

Figure 23B:
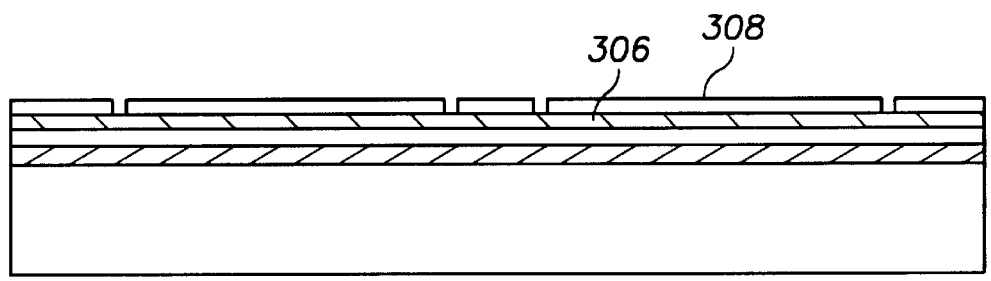

A 0.5 μm-thick LPCVD polysilicon layer 306 is then deposited on the insulating layers to form the lower electrical routing layer of the grating. A blanket boron ion implantation with a dose of about $5 \times 15$ cm$^{-2}$ and an energy of about 8 KeV is carried out to lower the resistivity of the polysilicon. After doping, the layer is patterned in the conventional manner, e.g., employing plasma etching techniques, to define a selected routing arrangement. As shown in FIG. 23B, an insulting layer 308, e.g., a silicon nitride layer of between about 3000 Å and about 5000 Å in thickness, is then deposited and patterned to electrically isolate the conducting routing layer 306 and form vias for contacting the routing layer.

Figure 23C:
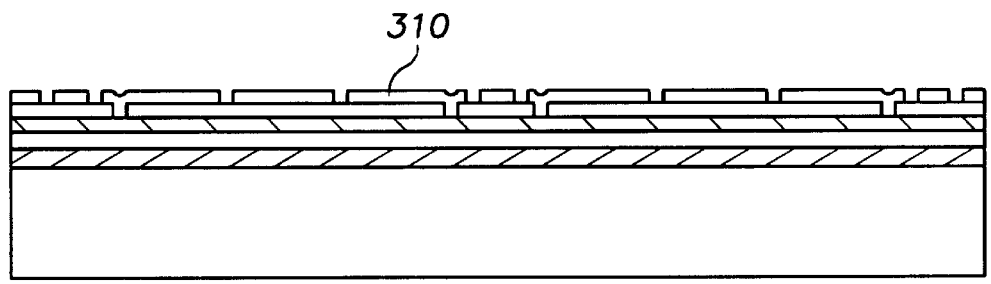
Figure 23D:
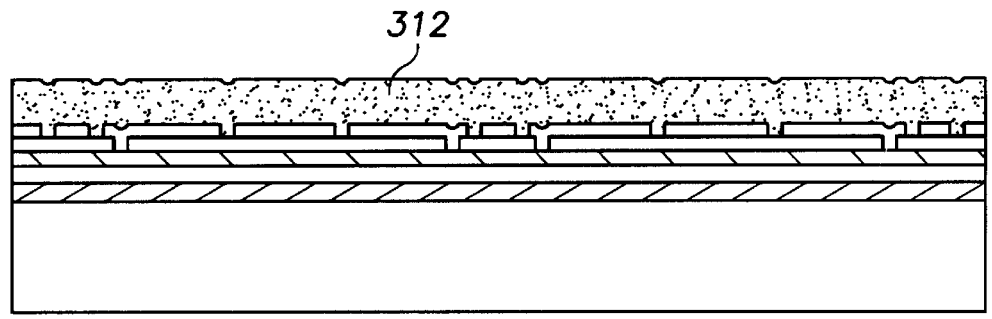
Figure 23E:
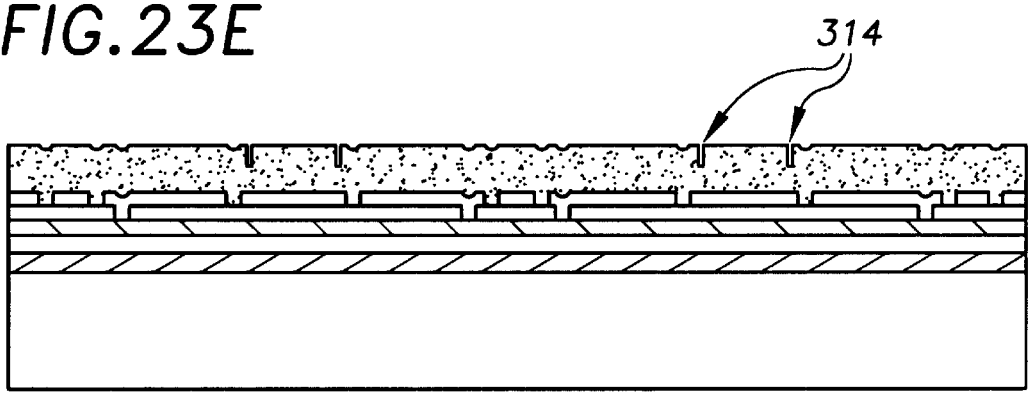

As shown in FIG. 23C, a second polysilicon layer 310, of, e.g., 0.5 μm in thickness, is then deposited by LPCVD, doped by implantation, and patterned to form the actuating electrode, grounded landing and post pads, and electrical routing. Referring to FIG. 23D, a sacrificial oxide layer 312, e.g., a layer of low temperature oxide with a thickness of about 2.0 μm, is deposited to define the actuation gap. In a first etch step, shown in FIG. 23E, the oxide layer is patterned and etched by a timed etch process to define dimple features 314 that will be replicated in the actuation beam. These dimples are provided, as explained earlier, as stand-offs that inhibit stiction of the beam to the substrate.

Figure 23F:
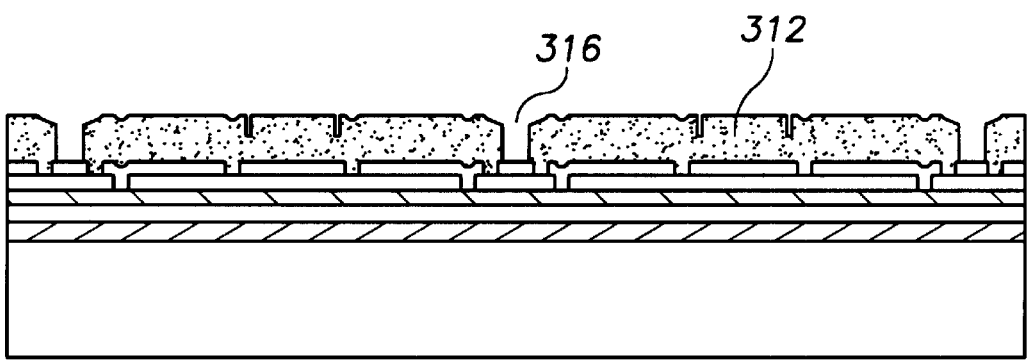
Figure 23G:
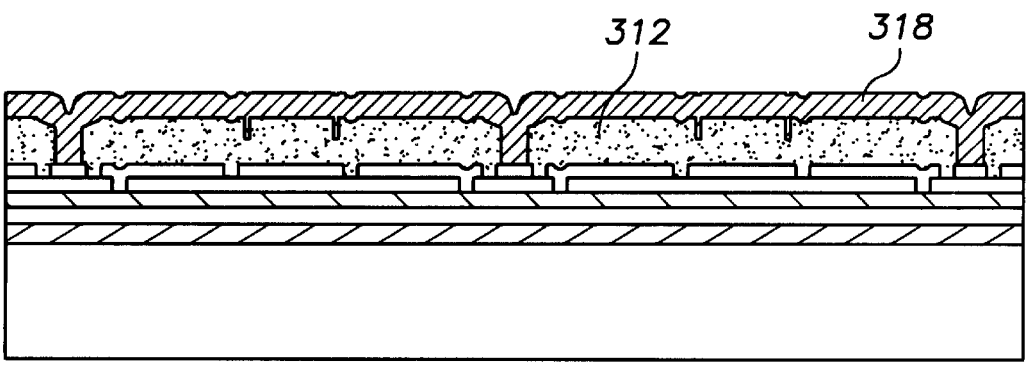

In a second oxide etch step, shown in FIGS. 23F, beam support post windows 316 are etched through the entire thickness of the oxide layer 312 to define the locations of the actuation beams' support posts. Referring to FIG. 23G, a polysilicon layer 318 of, e.g., 2.0 μm in thickness is then deposited, doped by implantation, and patterned to define rows of actuation beams. The polysilicon deposition conformally fills the support post windows 316 to form the support posts themselves.

Figure 23H:
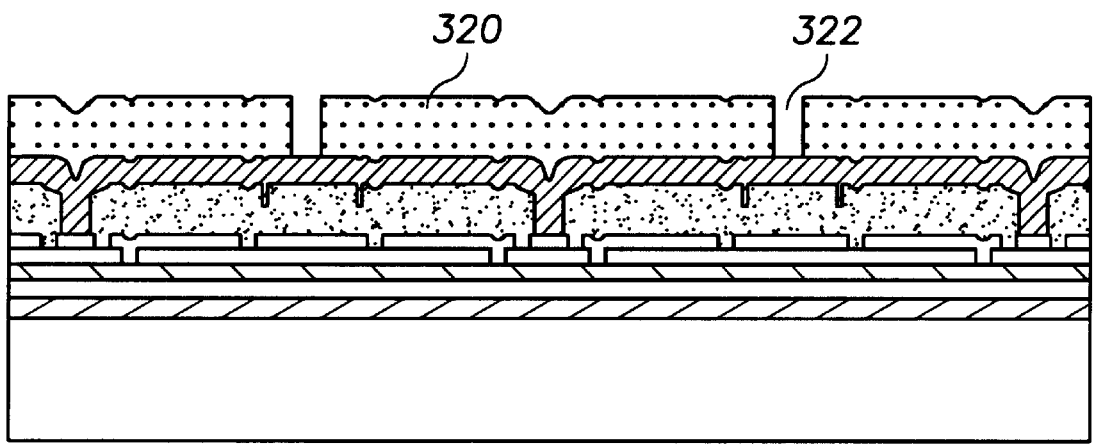
Figure 23I:
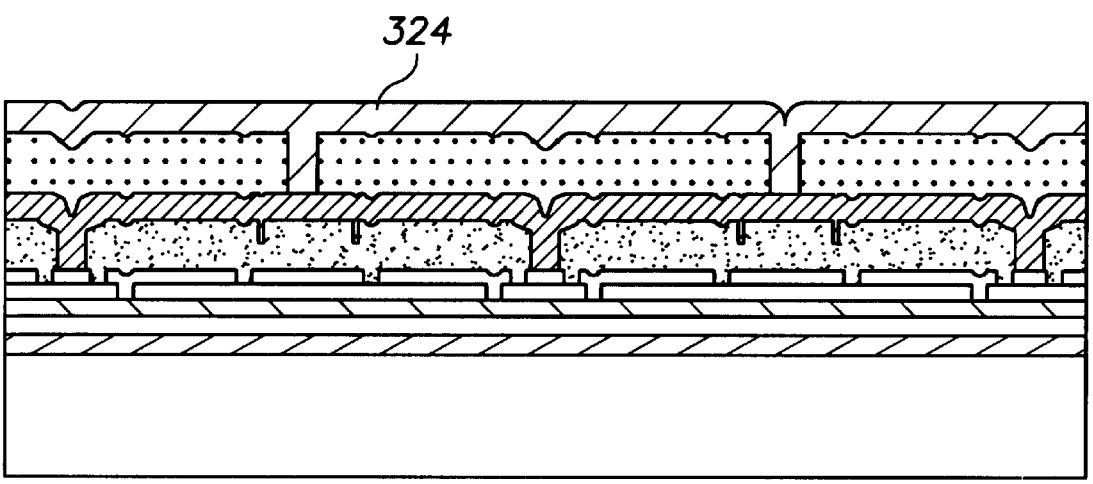

Turning to FIG. 23H, a sacrificial oxide layer 320, e.g., a layer of low temperature oxide of 2.0 µm in thickness, is deposited on the polysilicon layer 318 and patterned to define support post windows 322 etched through the entire thickness of the oxide layer 320. As shown in FIG. 23I, a polysilicon layer 324 of, e.g., 2.0 µm in thickness is then deposited, doped by implantation, and patterned to define rows of mirror beams. As with the earlier polysilicon deposition, this deposition conformally fills the support post windows 322 to form the support posts themselves. A capping layer of oxide, of, e.g., about 0.1 µm in thickness, can be deposited on the polysilicon layer, if desired, in anticipation of a next annealing step.

Films produced by the fabrication deposition sequence (the films not being shown in the figures, for clarity) are then removed from the backside of the wafer, and the back side is implanted to enable formation of a good contact. It is preferred that the backside film removal be carried out with consideration for substrate warpage, in the conventional manner. The substrate is then annealed, e.g., at a temperature of about 1075° C. for, e.g., about 5 hours. Preferably, the annealing time and temperature are optimized for the particular mechanical and materials properties of a given structure, in the conventional manner. With such optimization, the annealing process enables reduction of the residual stress in the mechanical polysilicon layers to near zero. The oxide capping layer is then removed.

Figure 23J:
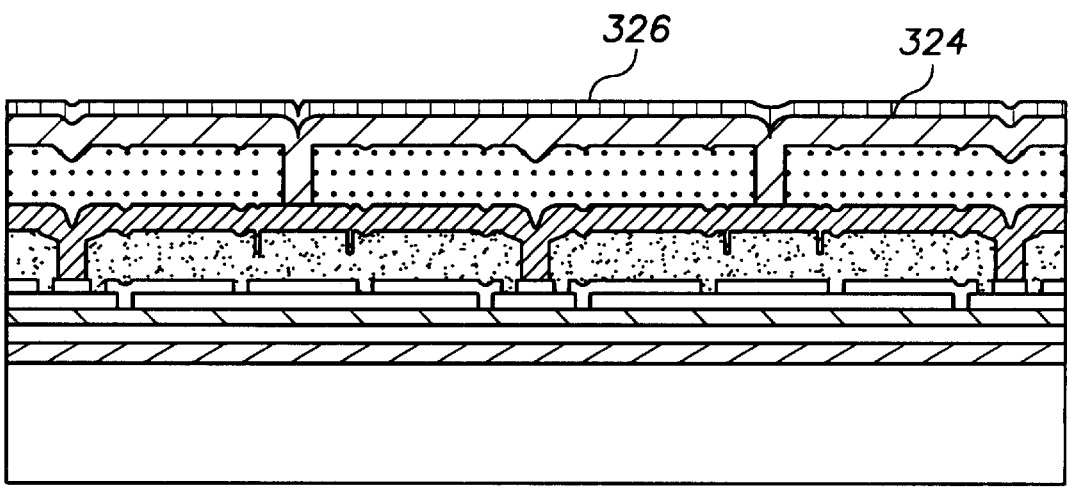

Referring to FIG. 23J, an optically reflective coating 326 is then deposited on the polysilicon layer 324, e.g., as a 200 Å-thick layer of chrome followed by a 5000 Å-thick layer of gold. The coating is then patterned and wet-etched in the conventional manner. The reflective coating layer is then employed as a masking material for a subsequent dry etch of the underlying polysilicon layer 324. This technique enables self-alignment of the reflecting layer and the mirror beam rows.

Bond pads are formed by patterning and etching of the two sacrificial oxide layers to expose the lower polysilicon routing layer 306 at appropriate locations on the die. A conventional chrome-gold deposition and lift-off process can then be employed to form and define contact pads.

Figure 23K:
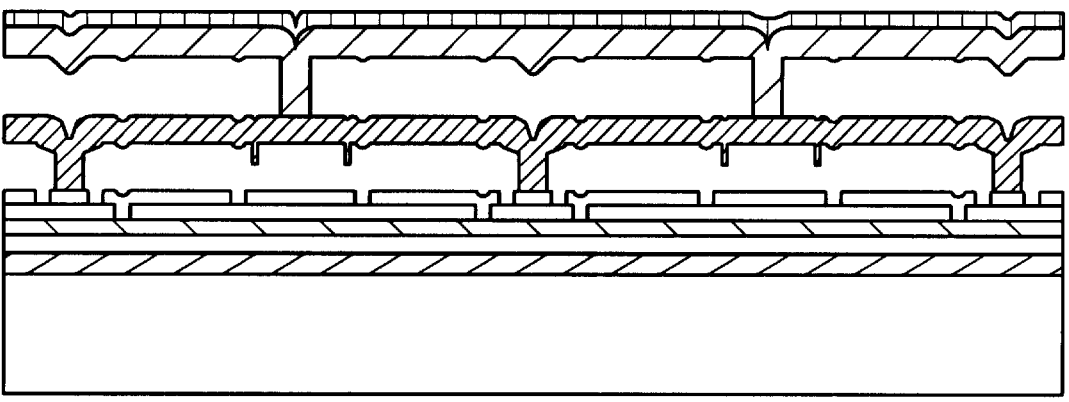

The substrate is then diced into separate die and each die is subjected to a micromachining etch to release the actuation and mirror beams. The sacrificial etch is performed using a 49% HF solution. The dies are then rinsed and freeze-dried to avoid stiction of the beams to the substrate during the release process. As shown in FIG. 23K, the suspended actuation beam and mirror beam rows and corresponding segmented actuating electrodes result.

This example surface micromachining process is not intended to limit the range of materials or fabrication technologies that can be employed to produce the optical grating and other actuation structures described above. For example, bulk micromachining, electro-machining, electro-deposition, electro-plating, rapid-prototyping, photochemical, and other manufacturing processes can be employed. Similarly, the materials components of the structures are not limited to those described above. It is to be recognized that while microelectronic materials can be particularly well-suited for many applications, given their electrical and mechanical characteristics, other material systems that enable control of residual stress can also be employed.

Figure 24:
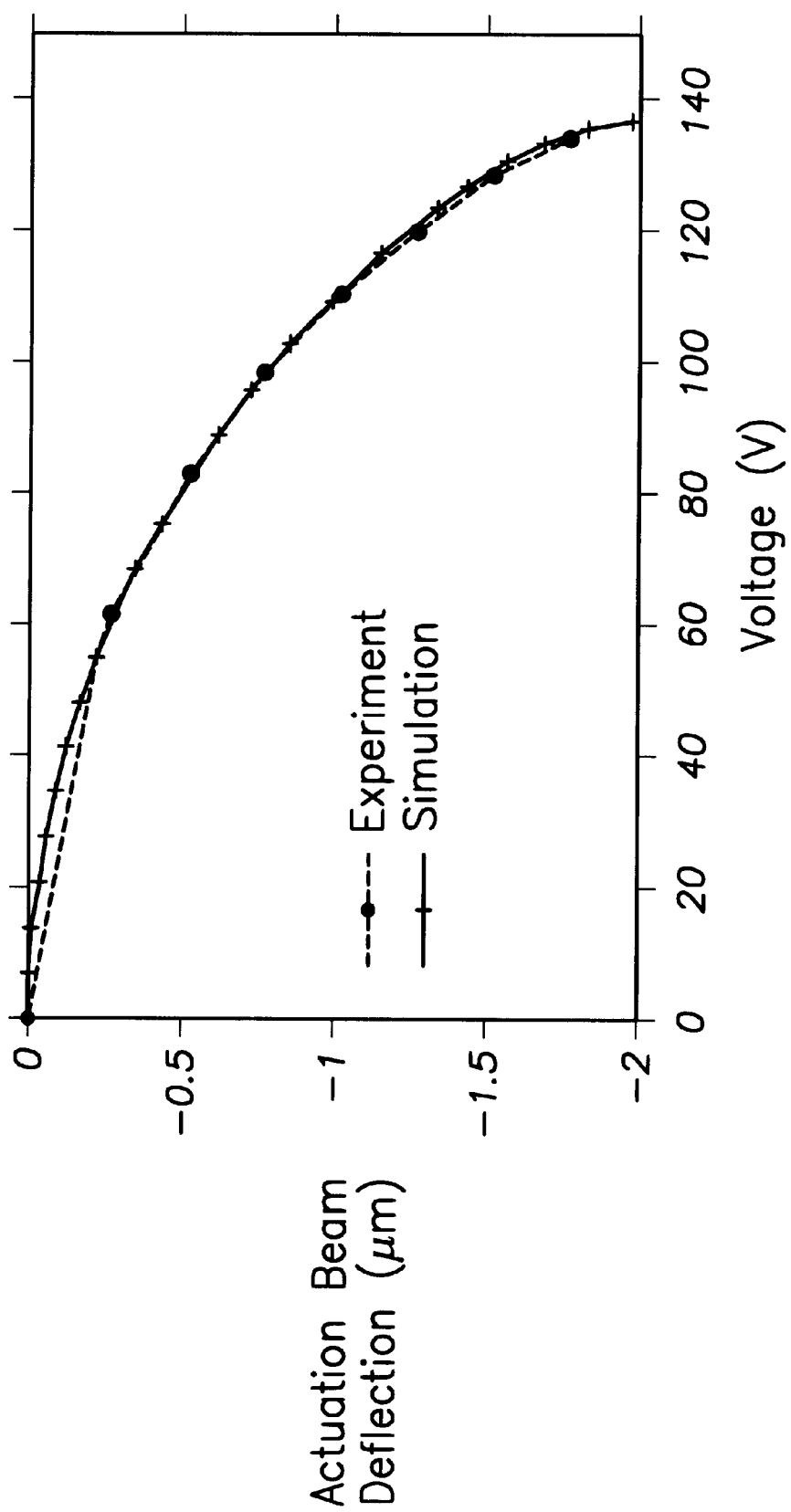
FIG. 24 is a plot of simulation and experimental data for actuation beam deflection as a function of applied voltage, for the diffraction grating element of FIG. 22.

FIG. 24 is a plot of actuation beam deflection as a function of applied voltage for simulation and experimental data for the grating design of FIG. 22 and the fabrication sequence of FIG. 23. As shown in the plot, the fabricated structure enabled more than about 1.75 µm displacement through a 2 µm actuation gap, thereby providing an actuation travel range far surpassing that of conventional electrostatic actuators.

This discussion highlights the wide range of applications of the electrostatic actuation structures provided by the invention. Precise analog positioning and control, as well as actuation voltage minimization, are enabled by the invention. It is recognized, of course, that those skilled in the art may make various modifications and additions to the actuation structures of the invention without departing from the spirit and scope of the present contribution to the art. Accordingly, it is to be understood that the protection sought to be afforded hereby should be deemed to extend to the subject matter of the claims and all equivalents thereof fairly within the scope of the invention.

We claim:

1. An electrostatically-controllable diffraction grating comprising:

a plurality of electrically isolated and stationary electrodes disposed on a substrate;

at least one row of a plurality of interconnected actuation elements, each actuation element in a row suspended, by a corresponding mechanically constrained support region, over the substrate by a vertical actuation gap, and each actuation element including a conducting actuation region connected to the corresponding actuation support region and disposed in a selected correspondence with at least one substrate electrode;

a mirror element provided for at least one actuation element in at least one row of actuation elements, each mirror element including an optically reflecting upper surface and being vertically suspended over a corresponding actuation element by a mechanically constrained mirror support region connected to the corresponding actuation element and defining a vertical mirror gap, each mirror element including a mirror deflection region connected to the mirror support region and free to be deflected through the mirror gap; and wherein the mirror gap of a mirror element is less than the actuation gap of a corresponding actuation element and is selected to produce controlled and stable displacement of the actuation region of a corresponding actuation element through a displacement range to a specified point in the actuation gap when an actuation voltage is applied between an actuation region and a corresponding stationary electrode, for diffracting a beam of light incident on the grating as the light beam is reflected from the upper surfaces of the mirror elements.

2. The electrostatically-controllable diffraction grating of claim 1 wherein the mirror element provided for at least one actuation element in at least one row of actuation elements comprises a row of a plurality of interconnected mirror elements provided for at least one row of actuation elements.

3. The electrostatically-controllable diffraction grating of claim 2 wherein the optically reflecting upper surface of at least one mirror element in a row of mirror elements is characterized by a substantial planarity, parallel with the substrate, that is maintained as a corresponding mirror deflection region is deflected through the mirror gap.

4. The electrostatically-controllable diffraction grating of claim 1 wherein the at least one row of actuation elements comprises a plurality of rows of actuation elements.

5. The electrostatically-controllable diffraction grating of claim 4 wherein the mirror element provided for at least one actuation element in at least one row of actuation elements comprises a mirror element provided for at least one actuation element in each row of actuation elements.

6. The electrostatically-controllable diffraction grating of claim 5 wherein the optically reflecting upper surface of at least one mirror element provided for a row of actuation elements is characterized by a substantial planarity and by a substantial parallelism with the optically reflecting upper surface of at least one mirror element provided in another row of actuation elements, the upper surface planarity and parallelism being maintained as a corresponding mirror deflection region is deflected through the mirror gap.

7. The electrostatically-controllable diffraction grating of claim 6 wherein the optically reflecting upper surface of each mirror element is parallel to the optically reflecting upper surface of all other mirror elements.

8. The electrostatically-controllable diffraction grating of claim 4 wherein at least one of the plurality of rows of actuation elements is provided with a row of a plurality of interconnected mirror elements.

9. The electrostatically-controllable diffraction grating of claim 1 wherein the mirror gap is further selected to maintain a substantial planarity of the mirror element deflection region during stable displacement of a corresponding actuation region.

10. The electrostatically-controllable diffraction grating of claim 9 wherein the mirror gap is further selected to maintain a substantial parallelism of the planar mirror element deflection region with the substrate during stable displacement of a corresponding actuation region.

11. The electrostatically-controllable diffraction grating of claim 1 wherein the optically reflecting mirror element upper surface is characterized by a substantial planarity that is maintained as a corresponding mirror deflection region is deflected through the mirror gap.

12. The electrostatically-controllable diffraction grating of claim 11 wherein the optically reflecting mirror element upper surface is further characterized by a substantial parallelism with the substrate that is maintained as a corresponding mirror deflection region is deflected through the mirror gap.

13. The electrostatically-controllable diffraction grating of claim 1 wherein each actuation element further comprises an actuation element deflection region free to be deflected through the actuation gap, the actuation region extending from about the actuation support region to the actuation element deflection region, a commonality in area between the actuation region and a corresponding stationary electrode being selected to produce controlled and stable displacement of the actuation element deflection region over a displacement range extending to the specified point in the actuation gap.

14. The electrostatically-controllable diffraction grating of claim 1 wherein the substrate comprises silicon.

15. The electrostatically-controllable diffraction grating of claim 14 wherein the silicon substrate further comprises an insulating surface layer.

16. The electrostatically-controllable diffraction grating of claim 1 wherein the electrodes comprise polycrystalline silicon.

17. The electrostatically-controllable diffraction grating of claim 1 wherein the actuation elements comprise polycrystalline silicon.

18. The electrostatically-controllable diffraction grating of claim 1 wherein the mirror element comprises polycrystalline silicon.

19. The electrostatically-controllable diffraction grating of claim 1 wherein the optically reflecting mirror element upper surface comprises a gold layer.

20. An electrostatically-controllable actuator comprising:
    a stationary electrode;
    an actuation element separated from the stationary electrode by an actuation gap, the actuation element including a mechanically constrained actuation support region and a conducting actuation region connected to the actuation support region and free to be deflected through the actuation gap;
    an auxiliary element separated from the actuation element by an auxiliary gap, the auxiliary element including a mechanically constrained auxiliary support region connected to the actuation element and a deflection region connected to the auxiliary support region and free to be deflected through the auxiliary gap; and
    wherein the auxiliary gap is less than the actuation gap, the auxiliary gap being selected to produce controlled and stable displacement of the actuation region over a displacement range extending to a specified point in the actuation gap when an actuation voltage is applied between the actuation region and the stationary electrode and selected to maintain a substantial planarity and parallelism of the auxiliary element deflection region with the stationary electrode during stable displacement of the actuation region.

21. The electrostatically-controllable actuator of claim 16 wherein the auxiliary element comprises a horizontal upper surface that is characterized by a substantial planarity that is maintained as the actuation region is displaced.

22. The electrostatically-controllable actuator of claim 16 wherein the actuation element further comprises an actuation element deflection region free to be deflected through the actuation gap, the actuation region extending from about the actuation support region to the actuation element deflection region, a commonality in area between the actuation region and the stationary electrode being selected to produce controlled and stable displacement of the actuation element deflection region over a displacement range extending to the specified point in the actuation gap.

* * * * *